US011366149B2

(12) United States Patent
Stuart et al.

(10) Patent No.: US 11,366,149 B2
(45) Date of Patent: Jun. 21, 2022

(54) ELECTRICAL NETWORK IMPEDANCE DETERMINATION

(71) Applicant: Analog Devices International Unlimited Company, Limerick (IE)

(72) Inventors: John Stuart, Edinburgh (GB); Seyed Amir Ali Danesh, Edinburgh (GB); Luca Martini, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/936,403

(22) Filed: Jul. 22, 2020

(65) Prior Publication Data

US 2021/0025929 A1    Jan. 28, 2021

Related U.S. Application Data

(60) Provisional application No. 62/879,241, filed on Jul. 26, 2019, provisional application No. 62/879,229, filed on Jul. 26, 2019.

(30) Foreign Application Priority Data

Jul. 20, 2020    (EP) .................................... 20186775

(51) Int. Cl.
    *G01R 27/18*    (2006.01)
    *G01R 31/50*    (2020.01)
    *G01R 31/08*    (2020.01)
(52) U.S. Cl.
    CPC ........... *G01R 27/18* (2013.01); *G01R 31/086* (2013.01); *G01R 31/50* (2020.01)
(58) Field of Classification Search
    CPC ...... G01R 27/18; G01R 31/50; G01R 31/086; G01R 19/2513; G01R 27/16; G01R 27/08
    (Continued)

(56) References Cited

U.S. PATENT DOCUMENTS

| 6,737,875 | B2 | 5/2004 | Davis et al. |
| 2009/0289637 | A1 | 11/2009 | Radtke |

(Continued)

FOREIGN PATENT DOCUMENTS

| CN | 101563824 B | 4/2012 |
| CN | 105717360 A | 6/2016 |

(Continued)

OTHER PUBLICATIONS

Mejia-Aguilar, Abraham, et al., "Electrical Impedance Measurement Using Voltage/Current Pulse Excitation", Proc. XIX Imeko World Congress: Fundamental and Applied Metrology, Lisbon, PT, (Sep. 6-1, 2009), 662-667.

(Continued)

*Primary Examiner* — Farhana A Hoque
(74) *Attorney, Agent, or Firm* — Schwegman Lundberg & Woessner, P.A.

(57) ABSTRACT

The present disclosure relates to the determination of impedances in an electrical network. Methods and apparatuses for determining one or more impedances within a root and branch network are disclosed. The impedance of a common root part and the impedance of a branch of the electrical network may be determined based on the current in the common root part, the current in a branch of the electrical network and the voltage across the common root part and the branch. By determining the impedance of different parts of the electrical network in this way, the network may be monitored over time and the location of any faults or impending faults in the network may be identified more exactly without requiring invasive network probing and testing.

20 Claims, 13 Drawing Sheets

(58) Field of Classification Search
USPC .......................................................... 324/522
See application file for complete search history.

(56) References Cited

U.S. PATENT DOCUMENTS

2010/0121594 A1    5/2010  Dougherty et al.
2017/0122991 A1*   5/2017  Aki ..................... H02J 13/0006

FOREIGN PATENT DOCUMENTS

| CN | 106154045 B | 10/2018 |
| EP | 2698642 | 2/2014 |
| EP | 3038224 | 6/2016 |
| GB | 2503442 | 1/2014 |
| SE | 1600074 | 3/2016 |
| WO | 2018191436 | 10/2018 |

OTHER PUBLICATIONS

Xiao, Yao, et al., "Harmonic Impedance Measurement using Voltage and Current Increments from Disturbing Loads", Proceedings of the IEEE 9th International Conference on Harmonics and Quality of Power (Cat. No. 00EX441). vol. 1, (2000), 220-225.

"European Application Serial No. 20186775.1, Extended European Search Report dated Dec. 9, 2020", 14 pgs.

Pegoraro, Paolo Attilio, "Line Impedance Estimation Based on Synchrophasor Measurements for Power Distribution Systems", IEEE Transactions on Instrumentation and Measurement, IEEE Service Center, Piscataway, NJ, US, vol. 68, No. 4, (Apr. 1, 2019), 1002-1013.

* cited by examiner

ELECTRICAL NETWORK IMPEDANCE DETERMINATION

TECHNICAL FIELD

The present disclosure relates to the determination of impedance in an electrical network.

BACKGROUND

For data centres, for example housing telecommunications equipment such as servers, downtime is often a significant metric for performance. Downtime is the amount, or proportion, of time over a particular period (such as a month, or a year) that the equipment within the data centre is non-operational. For example, during downtime the equipment within the data centre may be failing to operate and/or be inaccessible to network entities outside of the data centre. Each minute of downtown may be very costly to a data centre, so the minimisation of downtime is seen as an important goal by most data centres.

A large number of data centres include a number of back-up systems that are designed to reduce downtime. For example, the data centre may be fed by dual, independent power supplies so that if one power supply fails, the data centre may seamlessly switch to the other power supply. Likewise, some or all of the electrical distribution network within the data centre may be duplicated so that if a fault occurs within one system, the data centre may switch to the other system. Often, the power supplies and electrical distribution networks are monitored to identify faults or problems to be rectified to make sure everything is in good operational condition. Typically, this is performed by manual inspection of the hardware by trained technicians, sometimes with invasive measurements and/or replacements of components. This is not only time consuming and costly, but can itself by a cause of problems if the technician accidentally damages hardware during testing.

SUMMARY

The present disclosure relates to the determination of impedances in an electrical network. Methods and apparatuses for determining one or more impedances within a root and branch network are disclosed. The impedance of a common root part and the impedance of a branch of the electrical network may be determined based on the current in the common root part, the current in a branch of the electrical network and the voltage across the common root part and the branch. By determining the impedance of different parts of the electrical network in this way, the network may be monitored over time and the location of any faults or impending faults in the network may be identified more exactly without requiring invasive network probing and testing.

In a first aspect of the disclosure, there is provided a system for determining an impedance of an electrical network, wherein the electrical network comprises a common root part, a first branch and a second branch, wherein the first branch and the second branch are both coupled to the common root part of the electrical network, the system comprising: an electrical network monitoring unit configured to: determine a plurality of electrical measurement data sets, each electrical measurement data set comprising: a measure of current through the common root part, a measure of current through the first branch, a measure of current through the second branch, a measure of voltage across the first branch and common root part, and a measure of voltage across the second branch and common root part; define, using the plurality of electrical measurement data sets, a set of simultaneous equations that define a relationship between current, voltage and impedance of the first branch, the second branch, and the common root part; and determine, by solving the set of simultaneous equations, one or more of: an impedance of the common root part, an impedance of the first branch, an impedance of the second branch.

At least one of the electrical measurement data sets may be linearly independent from at least one other of the electrical measurement data sets.

Each set of each electrical measurement data set may correspond to a different point in time.

The measures of current and voltage in a first electrical data set of the plurality of electrical data sets may be taken at a first point in time and the measures of current and voltage in a second electrical data set of the plurality of electrical data sets may be taken at a second point in time, and wherein at least one of the following may apply: the current in the first branch at the first point in time is different to the current in the first branch at the second point in time; the current in the second branch at the first point in time is different to the current in the second branch at the second point in time; and/or the current in the common root part at the first point in time is different to the current in the common root part at the second point in time.

At least one of the following may apply: the current in the first branch at the first point in time is different to the current in the first branch at the second point in time by at least a current difference threshold; the current in the second branch at the first point in time is different to the current in the second branch at the second point in time by at least a current difference threshold; and/or the current in the common root part at the first point in time is different to the current in the common root part at the second point in time by at least a current difference threshold.

The measure of current through the common root part may be a measure of change in current through the common root part, and wherein the measure of current through the first branch may be a measure of change in current through the first branch, and wherein the measure of current through the second branch may be a measure of change in current through the second branch, and wherein the measure of voltage across the first branch and common root part may be a measure of change in voltage across the first branch and common root part, and wherein the measure of voltage across the second branch and common root may be a measure of change in voltage across the second branch and common root part.

The electrical network monitoring unit may be further configured to: detect a transition in the current that exceeds a current transition threshold in at least one of: the first branch, the second branch, the common root part; and determine an electrical data set of the plurality of electrical data set to correspond to the detected transition, such that the measures of current and voltage in the electrical data set are indicative of the changes in current and voltage corresponding to the detected transition.

The measure of voltage across the first branch and common root part may be a difference between a voltage measurement taken at the common root part and a voltage measurement taken at the first branch, and wherein the measure of voltage across the second branch and common root part may be a difference between the voltage measurement taken at the common root part and a voltage measurement taken at the second branch.

The set of simultaneous equations may comprise at least as many equations as the number of impedances to be determined by the electrical network monitoring unit.

The electrical network monitoring unit may be further configured to monitor the condition of at least part of the electrical network based on the determined one or more of: the impedance of the common root part, the impedance of the first branch, the impedance of the second branch.

Monitoring the condition of at least part of the electrical network may comprise determining whether or not a fault has occurred in the at least part of the electrical network.

The electrical network monitoring unit may be further configured to detect a fault in the common root part if at least one of the following conditions is met: the measure of impedance of the common root part exceeds a maximum threshold value; and/or the measure of impedance of the common root part is below a minimum threshold value.

The electrical network monitoring unit may be further configured to detect a fault in the first branch if at least one of the following conditions is met: the measure of impedance of the first branch of exceeds a first branch maximum threshold value; and/or the measure of impedance of the first branch is below a first branch minimum threshold value.

The electrical network monitoring unit may be further configured to detect a fault in the second branch if at least one of the following conditions is met: the measure of impedance of the second branch of exceeds a second branch maximum threshold value; and/or the measure of impedance of the second branch is below a second branch minimum threshold value.

The electrical network monitoring unit may be further configured to generate an electrical network condition report based at least in part on the determined one or more of: the impedance of the common root part, the impedance of the first branch, the impedance of the second branch.

Determining whether or not a fault has occurred in the common root part of the electrical network may be based on at least one of the following: a magnitude of changes of the determined impedance of the common root part over time; and/or a rate of change of the determined impedance of the common root part over time.

If a fault in the electrical network is detected, the electrical network condition report may comprise an indication of the fault.

The electrical network may form at least part of a data centre power distribution network.

The system may further comprise: a first current sensor coupled to the electrical network monitoring unit and arranged to measure current in the first branch; a second current sensor coupled to the electrical network monitoring unit and arranged to measure current in the second branch; a third current sensor coupled to the electrical network monitoring unit and arranged to measure current in the common root part; a first voltage sensor coupled to the electrical network monitoring unit and configured to measure a voltage at the first branch relative to a reference potential; a second voltage sensor coupled to the electrical network monitoring unit and configured to measure a voltage at the second branch relative to the reference potential; and a third voltage sensor coupled to the electrical network monitoring unit and configured to measure a voltage at the common root part relative to the reference potential; wherein the first voltage sensor and third voltage sensor are arranged such that a difference between the measured voltage at the common root part and the measured voltage at the first branch is the measure of voltage across the first branch and common root part of the electrical network, and wherein the second voltage sensor and third voltage sensor are arranged such that a difference between the measured voltage at the common root part and the measured voltage at the second branch is the measure of voltage across the second branch and common root part of the electrical network.

In a second aspect of the disclosure, there is provided a method for determining an impedance of an electrical network, wherein the electrical network comprises a common root part, a first branch and a second branch, wherein the first branch and the second branch are both coupled to the common root part of the electrical network, the method comprising: determining a plurality of electrical measurement data sets, each electrical measurement data set comprising: a measure of current through the common root part, a measure of current through the first branch, a measure of current through the second branch, a measure of voltage across the first branch and common root part, and a measure of voltage across the first branch and common root part; defining, using the plurality of electrical measurement data sets, a set of simultaneous equations that define a relationship between current, voltage and impedance of the first branch, the second branch and the common root part; and determining, by solving the set of simultaneous equations, one or more of: an impedance of the common root part, an impedance of the first branch, an impedance of the second branch.

In a third aspect of the present disclosure, there is provided a computer program configured to perform the method of the second aspect when executed on at least one processor of an electronic device.

In a fourth aspect of the present disclosure, there is provided an electrical network monitoring unit, configured to: determine one or more measurements of impedance of at least part of an electrical network; and monitor a condition of at least part of the electrical network based on the one or more measurements of impedance.

A fault may be determined to have occurred if at least one of the following conditions is met: one or more of the measurements of impedance exceeds a maximum threshold value; and/or one or more of the measurements of impedance is below a minimum threshold value.

The electrical network monitoring unit may be further configured to generate an electrical network condition report based at least in part on the at least one measurement of impedance, wherein the electrical network condition report is indicative of the condition of at least part of the electrical network.

If a fault in the electrical network is detected, the electrical network condition report may comprise an indication of the fault.

The electrical network may form at least part of a data centre power distribution network.

Numbered Clauses

Parts of the disclosure are presented in the following are non-limiting numbered clauses:

Aspect 1. A method of determining an impedance of at east part of an electrical network, the method comprising:
  determining a voltage measurement at a first point in the electrical network at a first time;
  determining a current measurement indicative of the current flowing through the first point in the electrical network at the first time;
  determining a further voltage measurement at the first point in the electrical network at a second time, wherein the first time is different to the second time;

determining a further current measurement indicative of the current following through the first point in the electrical network at the second time; and determining the impedance of at least part of the electrical network based on a difference between the voltage measurement at the first point and the further voltage measurement at the first point and a difference between the current measurement and the further current measurement.

Aspect 2. The method of aspect 1, further comprising determining the second time based at least in part on a current following through the electrical network.

Aspect 3. The method of aspect 2, wherein the second time is determined to be at a moment in time after the current following through the first point is determined to be different to the current measurement determined at the first time.

Aspect 4. The method of any preceding aspect, wherein a difference between the current measurement and the further current measurement exceeds a current difference threshold.

Aspect 5. The method of any preceding aspect, further comprising applying a time-varying current signal to the electrical network.

Aspect 6. The method of any preceding aspect, further comprising:
  determining a voltage measurement at a second point in the electrical network at the first time;
  determining a further voltage measurement at the second point in the electrical network at the second time; and
  wherein determining the impedance of at least part of the electrical network is further based on a difference between the voltage measurement at the second point and the further voltage measurement at the second point.

Aspect 7. The method of any of aspects 1 to 5, further comprising:
  determining a voltage measurement at a second point in the electrical network at a third time;
  determining a current measurement indicative of the current flowing through the second point in the electrical network at the third time;
  determining a further voltage measurement at the second point in the electrical network at a fourth time, wherein the fourth time is different to the third time;
  determining a further current measurement indicative of the current following through the second point in the electrical network at the fourth time;
  wherein determining the impedance of at least part of the electrical network is further based on a difference between the voltage measurement at the second point and the further voltage measurement at the second point and a difference between the current measurement indicative of the current following through the second point and the further current measurement indicative of the current following through the second point.

Aspect 8. The method of aspect 6 or aspect 7, wherein the impedance of at least part of the electrical network comprises an impedance between the first point in the electrical network and the second point in the electrical network.

Aspect 9. The method of any preceding aspect, wherein the voltage measurements comprise RMS voltage measurements; and
  wherein the current measurements comprise RMS current measurements.

Aspect 10. The method of any preceding aspect, wherein determining the impedance of at least part of the electrical network is further based on a thermal model of the at least part of the electrical network.

Aspect 11. An electrical network monitoring module configured to perform the method of any preceding aspect Aspect 12. A computer program configured to perform the method of any of aspects 1 to 10 when executed on at least one processor of an electronic device.

Aspect 13. An electrical network monitoring module, configured to:
  determine one or more measurements of impedance of at least part of an electrical network; and
  monitor a condition of at least part of the electrical network based on the one or more measurements of impedance.

Aspect 14. The electrical network monitoring module of aspect 13, wherein monitoring the condition of at least part of the electrical network comprises monitoring changes in the impedance of the at least part of the electrical network.

Aspect 15. The electrical network monitoring module of aspect 13 or aspect 14, wherein monitoring the condition of at least part of the electrical network comprises determining whether or not a fault has occurred in the at least part of the electrical network.

Aspect 16. The electrical network monitoring module of aspect 15, wherein a fault is determined to have occurred if at least one of the following conditions is met:
  one or more of the measurements of impedance exceeds a maximum threshold value;
  one or more of the measurements of impedance is below a minimum threshold value.

Aspect 17. The electrical network monitoring module of aspect 15 or aspect 16, wherein determining whether or not a fault has occurred in the at least part of the electrical network is based on at least one of the following:
  a magnitude of changes of the measurements of impedance over time;
  a rate of change of the measurements of impedance over time;
  a comparison of one or more measurements of impedance against one or more other measurements of impedance for another part of the electrical network.

Aspect 18. The electrical network monitoring module of any of aspects 13 to 17, wherein the electrical network monitoring module is further configured to generate an electrical network condition report based at least in part on the at least one measurement of impedance, wherein the electrical network condition report is indicative of the condition of at least part of the electrical network.

Aspect 19. The electrical network monitoring module of aspect 18, wherein if a fault in the electrical network is detected, the electrical network condition report comprises an indication of the fault.

Aspect 20. The electrical network monitor module of any of aspects 13 to 19, wherein the electrical network forms at least part of a data centre power distribution network.

Aspect 21. A system for monitoring at least part of an electrical network, the system comprising:
  a first voltage measurement device for coupling to the electrical network at a first point in the electrical network to measure a voltage at the first point of the electrical network;
  a current measurement device for measuring an current flowing through the first point; and
  an electrical network monitoring module, coupled to the first voltage measurement device and the current measurement device, wherein the electrical network monitoring module is configured to determine an impedance of at least part of the electrical network according to the method of any of aspects 1 to 10.

Aspect 22. A method of determining an impedance of a common root part of an electrical network, wherein the electrical network comprises a first branch and a second branch, wherein the first branch and the second branch are coupled to the common root part of the electrical network, the method comprising:

when current in the first branch is substantially zero, determining a voltage measurement at a first point in the electrical network at a first time, wherein the first point is in the first branch of the electrical network;

determining a current measurement indicative of the current flowing through a first point in the electrical network at the first time, wherein the second point is in the second branch of the electrical network;

determining a further voltage measurement at the first point in the electrical network at a second time, wherein the first time is different to the second time;

determining a further current measurement indicative of the current following through the second point in the electrical network at the second time; and determining the impedance of the common root part of the electrical network based on a difference between the voltage measurement at the first point and the further voltage measurement at the first point and a difference between the current measurement at the second point and the further current measurement at the second point.

Aspect 23. A method of determining an impedance between a first point of an electrical network and a second point of the electrical network, the method comprising:

determining a first measure of voltage using, at least in part, a first voltage measurement device and a second measure of voltage using, at least in part, a second voltage measurement device,
  wherein the first measure of voltage is indicative of a voltage at the first point of the electrical network when an alternating current carried in the electrical network is substantially equal to zero, and
  wherein the second measure of voltage is indicative of a voltage at the second point of the electrical network when the alternating current carried in the electrical network is substantially equal to zero;

determining a gain correction value based on the first measure of voltage and the second measure of voltage, wherein the gain correction value is indicative of a gain difference between the first voltage measurement device and the second voltage measurement device;

determining, at a time when an alternating current carried in the electrical network is substantially non-zero:
  a third measure of voltage at the first point of the electrical network using the first voltage measurement device,
  a fourth measure of voltage at the second point of the electrical network using the second voltage measurement device, and
  a measure of current in the electrical network at a time when an alternating current carried in the electrical network is substantially non-zero; and determining the impedance between the first point of the electrical network and the second point of the electrical network based on the third measure of voltage, the fourth measure of voltage, the measure of current and the gain correction value.

Aspect 24. The method of aspect 23, wherein the gain correction value comprises a ratio of the first measure of voltage and the second measure of voltage.

Aspect 25. The method of either aspect 23 or 24, wherein determining the first measure of voltage comprises determining one or more measurements of voltage using the first voltage measurement device at a corresponding one or more moments when the alternating current carried in the electrical network is substantially equal to zero, and
  wherein determining the second measure of voltage comprises determining one or more measurements of voltage using the second voltage measurement device at a corresponding one or more moments when the alternating current carried in the electrical network is substantially equal to zero.

Aspect 26. The method of aspect 25, wherein the first measure of voltage comprises an average of the one or more measurements of voltage determined using the first voltage measurement device, and
  wherein the second measure of voltage comprises an average of the one or more measurements of voltage determined using the second voltage measurement device.

Aspect 27. The method of any of aspects 23 to 26, wherein determining the first measure of voltage comprises frequency domain analysis of the alternating current carried in the electrical network and a first voltage signal measured by the first voltage measurement device; and
  wherein determining the second measure of voltage comprises frequency domain analysis of the alternating current carried in the electrical network and a second voltage signal measured by the second voltage measurement device.

Aspect 28. The method of aspect 27, wherein determining the first measure of voltage comprises:
  comparing a phase of the alternating current and a phase of the first voltage signal to determine a first phase of the first voltage signal at which the alternating current is substantially zero; and
  determining an amplitude of the first voltage signal at the first phase of the first voltage signal,
  wherein determining the second measure of voltage comprises:
  comparing the phase of the alternating current and a phase of the second voltage signal to determine a second phase of the second voltage signal at which the alternating current is substantially zero; and
  determining an amplitude of the second voltage signal at the second phase of the second voltage signal.

Aspect 29. The method of any of aspects 23 to 28, wherein determining the impedance between the first point of the electrical network and the second point of the electrical network comprises:
  correcting the fourth measure of voltage using the gain correction value; and
  determining the impedance between the first point of the electrical network and the second point of the electrical network based on dividing a difference between the third measure of voltage and the corrected fourth measure of voltage by the measure of current.

Aspect 30. The method of any of aspects 27 to 29, wherein the frequency domain analysis comprises performing a fast Fourier transform, FFT.

Aspect 31. The method of any of aspects 23 to 30, wherein the electrical network forms at least part of a data centre power distribution network.

Aspect 32. An electrical network monitoring module configured to perform the method of any of aspects 23 to 31.

Aspect 33. A computer program configured to perform the method of any of aspects 23 to 31 when executed on at least one processor of an electronic device.

Aspect 34. An electrical network monitoring module, configured to:
  determine, over a period of time, a plurality of measurements of impedance between a first point of an electrical network and a second point of the electrical network; and
  monitor a condition of at least part of the electrical network based on the plurality of measurements of impedance.

Aspect 35. The electrical network monitoring module of aspect 34, wherein monitoring the condition of at least part of the electrical network comprises monitoring changes in the impedance between the first point of the electrical network and the second point of the electrical network based on the plurality of measurements of impedance.

Aspect 36. The electrical network monitoring module of aspect 34 or aspect 35, wherein monitoring the condition of at least part of the electrical network comprises determining whether or not a fault has occurred in the electrical network between the first point of the electrical network and the second point of the electrical network.

Aspect 37. The electrical network monitoring module of aspect 36, wherein a fault is determined to have occurred if at least one of the following conditions is met:
  one or more of the plurality of measurements of impedance exceeds a maximum threshold value;
  one or more of the plurality of measurements of impedance is below a minimum threshold value.

Aspect 38. The electrical network monitoring module of aspect 34 or aspect 35, wherein determining whether or not a fault has occurred in the at least part of the electrical network is based on at least one of the following:
  a magnitude of changes of the measurements of impedance over time;
  a rate of change of the measurements of impedance over time;
  a comparison of one or more measurements of impedance against one or more other measurements of impedance for another part of the electrical network.

Aspect 39. The electrical network monitoring module of any of aspects 34 to 38, wherein the electrical network monitoring module is further configured to generate an electrical network condition report based at least in part on the plurality of measurements of impedance, wherein the electrical network condition report is indicative of the condition of at least part of the electrical network.

Aspect 40. The electrical network monitor module of aspect 39, wherein if a fault in the electrical network between the first point of the electrical network and the second point of the electrical network is detected, the electrical network condition report comprises an indication of the fault.

Aspect 41. The electrical network monitor module of any of aspects 34 to 40, wherein the electrical network forms at least part of a data centre power distribution network.

Aspect 42. A system for monitoring at least part of an electrical network, the system comprising:
  a first voltage measurement device for coupling to the electrical network at a first point in the electrical network to measure a voltage at the first point of the electrical network;
  a second voltage measurement device for coupling to the electrical network at a second point in the electrical network to measure a voltage at the second point of the electrical network;
  a current measurement device for measuring an alternating current carried in the electrical network; and
  an electrical network monitoring module, coupled to the first voltage measurement device, the second voltage measurement device and the current measurement device, wherein the electrical network monitoring module is configured to determine an impedance between the first point of an electrical network and the second point of the electrical network based at least in part on: one or more measurements of voltage by the first voltage measurement device; one or more measurements of voltage by the second voltage measurement device; and one or more measurements of current by the current measurement device.

DRAWINGS

Aspects of the present disclosure are described, by way of example only, with reference to the following drawings, in which.

DETAILED DESCRIPTION

The present disclosure relates to the determination of impedance of at least part of an electrical network, for example the electrical power network of a data centre. Techniques are disclosed for accurately determining impedance that enable the impedance of one or more different parts of the network to be monitored. Changes in impedance can be indicative of faults, or impending faults, within the network, which may then be investigated and rectified. Therefore, by accurately determining and monitoring impedances in the electrical network, the condition of the electrical network may be more straightforwardly and cheaply monitored compared with existing manual inspection techniques, and with reduced risk of introducing faults during the process of inspection.

A technique for determining impedances in an electrical network that comprises a common root part and two or more branch parts that are both connected to the common root part at a common node. The electrical network is such that the current flowing through each of the branches is combined in the common root part (for example, current flows through the common root part and then branches off into each separate branch of the electrical network). According to the technique the impedance of the common root part and the impedance of any one or more of the branches may be determined using voltage and current measurements taken at the ends of the common root part and the branches. For example, no measurement meter is required at the common node of the electrical network. As a result, a measurement of impedance of each different part of the electrical network may be determined with greater accuracy and ease than trying to measure voltage and current at the common node. By determining impedance of each part of the electrical network, different parts of the electrical network may be monitored, enabling more accurate identification of potential faults within the electrical network to be achieved.

Figure 1:
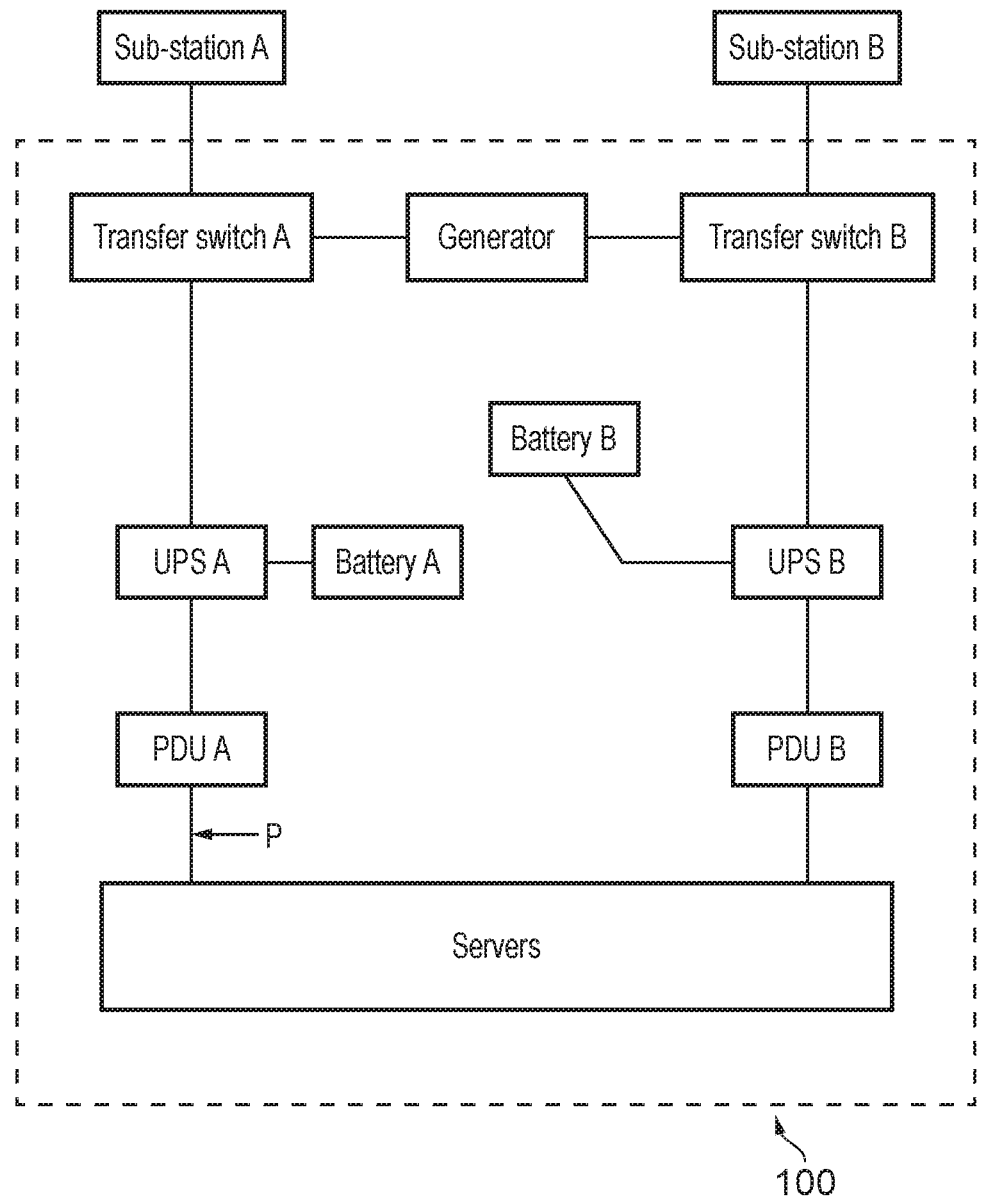
FIG. 1 shows a highly simplified, schematic representation of the electrical power network of an example data centre.

FIG. 1 shows a highly simplified, schematic representation of the electrical power network of an example data centre 100. As can be seen, power is supplied to the servers by two separate, duplicated systems A and B. Power system A may be the primary system and power system B may be the back-up system. In the event of an issue or failure in power system A, or during routine maintenance of power supply A, power system B may be used to power the servers. Alternatively, they maybe complimentary systems with both power system A and power system B being using simultaneously in normal situations (for example, each loaded to about 40% of their capacity). If one of the systems fails, the other system may then become the sole power system (for example, loaded to about 80% of its capacity). In the example of FIG. 1, each power system A and B includes a transfer switcher, to switch between generator and sub-station power, an uninterruptable power supply (UPS) and battery, and a power distribution unit (PDU). It will be appreciated that the devices, units and components represented in FIG. 1 are merely examples and that additional and/or alternative devices, units and components may be used in a data centre power distribution network.

In order to minimise downtime, the inventors have recognised that it would be beneficial to identify as early as possible potential problems within a power system, so that the power supply may be switched to the other power system before a fault occurs, thereby minimising downtime. The potential problem may then be rectified quickly so that both power systems are available for use.

To monitor the health of the electrical power network of the data centre 100, the inventors have developed a technique for accurately determining and monitoring the impedance of one or more parts of the network. For example, FIG. 1 shows a point P in the network. Example techniques for determining the impedance of the electrical network looking back towards the electrical source (in this instance, back towards sub-station A), i.e., the impedance of the electrical network 'upstream' of point P, are disclosed. It will be appreciated that the location of point P represented in FIG. 1 is merely one particular example and that it may alternatively be positioned anywhere else where power flows in the electrical network. Furthermore, the impedance between multiple different pairs of points may be determined using the techniques below so that the impedance of various different parts of the electrical network may be accurately determined and monitored. This may be used, for example, to determine the impedance of particular sections/parts/components of the electrical network based on a difference between the impedance determined at two different points.

The inventors have realised that monitoring the impedance of one or more parts of the electrical network may be helpful in monitoring the health of the electrical network because changes in impedance may be indicative of a potential problem within the part of the electrical network being monitored. For example, an increase in impedance at point P may be indicative of a fault, or potential future fault, in one or more of the components and elements 'upstream' of point P. This can then be investigated in detail and action taken. By monitoring the electrical network in this way, the electrical network may be continually monitored efficiently and cheaply, with action and intervention needed only when a potential fault is identified.

Whilst the present disclosure focusses particularly on data centres, it will be appreciated that the techniques are applicable to any type of electrical network.

Differential Determination of Impedance

Figure 2:
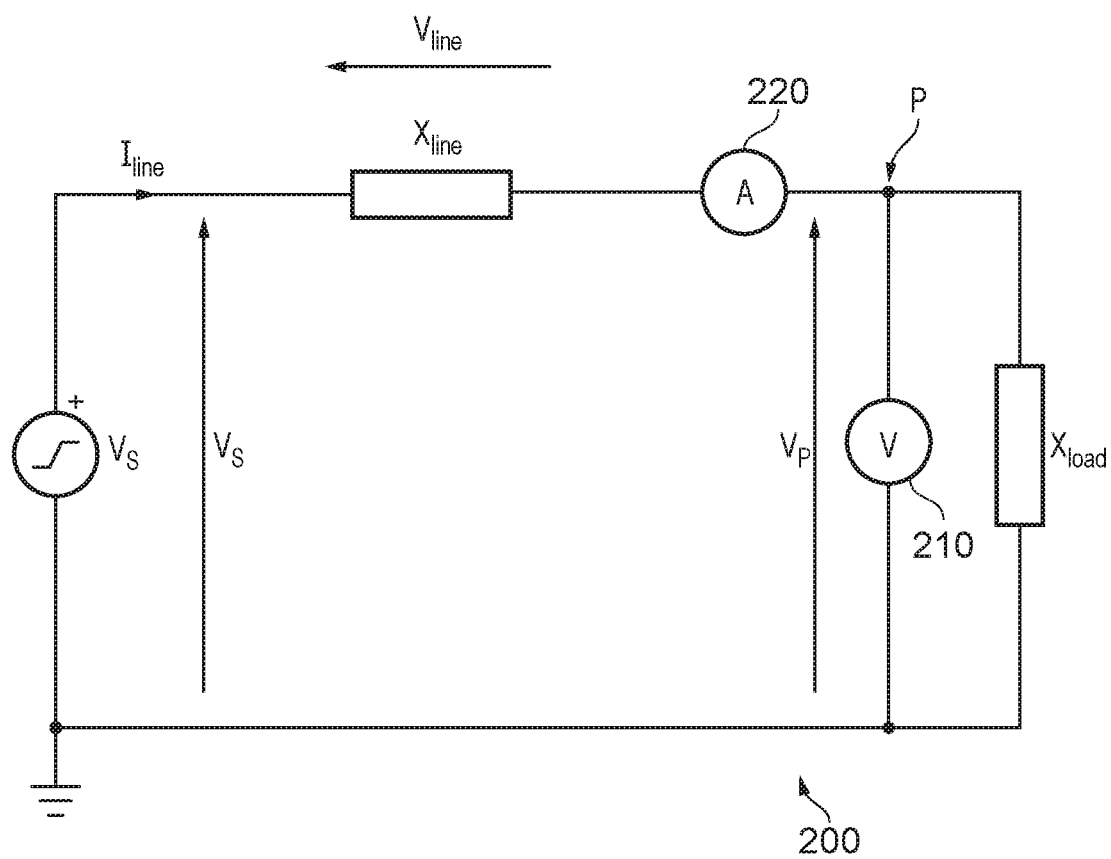
FIG. 2 shows a simplified circuit representing part of the electrical power network of FIG. 1.

FIG. 2 shows a simplified circuit 200 representing part of the electrical network 100. The simplified circuit 200 shows a voltage source supplying a voltage $V_s$, representing the voltage supplied to the electrical network, and a line current $I_{line}$, representing the current carried in the electrical network through point P.

The line impedance $X_{line}$ represents the total impedance of the electrical network upstream of point P (i.e., between point P and the voltage source). The line impedance $X_{line}$ represents the combined impedance of all components and elements upstream of point P, for example switches, wiring, etc. The line impedance $X_{line}$ may comprise a resistance component and/or a reactance component caused by capacitance and/or inductance upstream of P.

The load impedance $X_{load}$ represents the combined impedance of all components and elements between point P and ground and may comprise a resistance component and/or a reactance component caused by capacitance and/or inductance between point P and ground.

In the explanation below, a first voltage measurement apparatus 210 is used to measure a voltage $V_P$ at point P with respect to a reference voltage, for example ground (although any other suitable reference voltage could be used). In this example, the first voltage measurement apparatus 210 measures the voltage $V_P$ across the load impedance $X_{load}$. The first voltage measurement apparatus 210 may be any suitable type of voltage measurement apparatus that will be well known to the skilled person.

It has been identified by the inventors that if there is a change in line current $I_{line}$, for example as a result of a change in the load impedance $X_{load}$ caused, for example, by a load component switching in or out of the load, voltage and current measurements taken at point P before and after the change may be used to determine the line impedance $X_{line}$.

Figure 3:
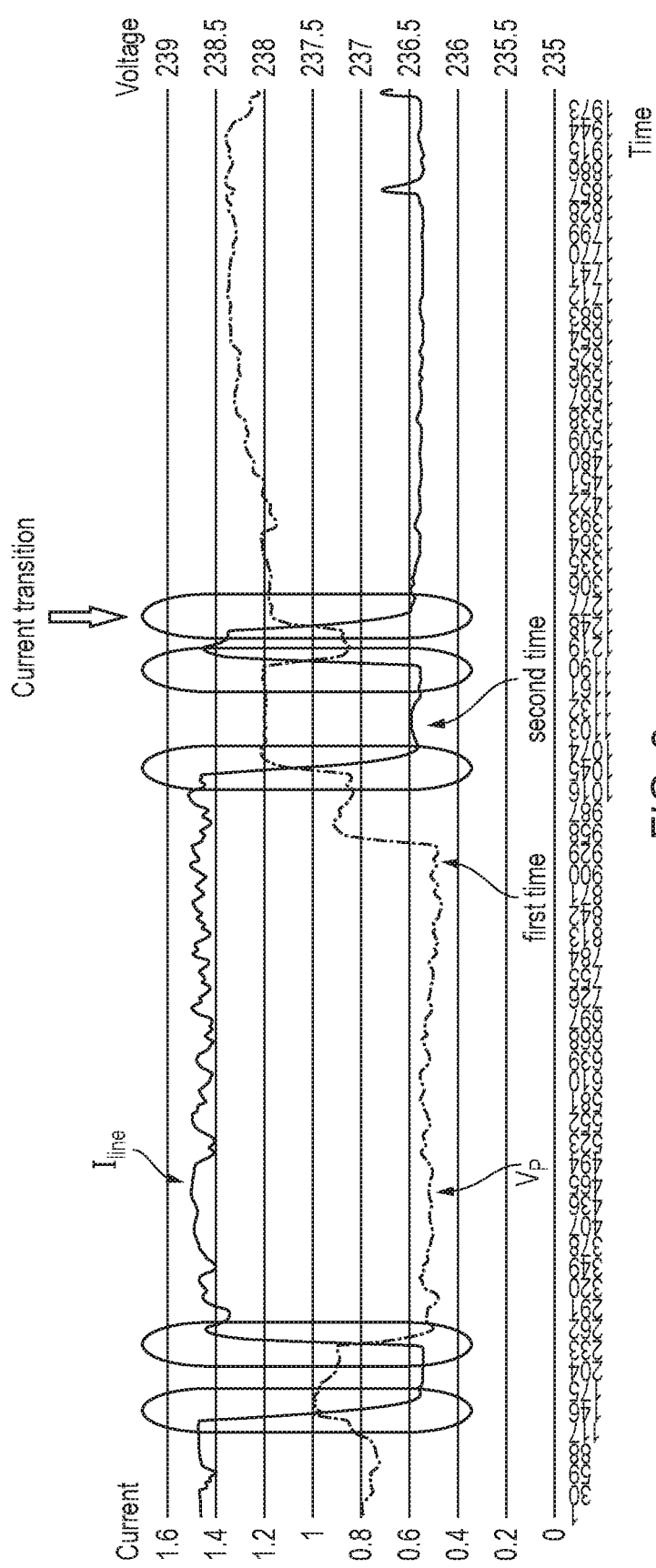
FIG. 3 shows an example representation of current and voltage in the electrical power network over time.

FIG. 3 shows an example representation of $I_{line}$ and $V_P$ over time. It will be appreciated that the units of current and voltage are merely examples and that the techniques described herein may be applied to electrical networks carrying any sizes of voltage and current. Furthermore, the voltage and currents represented are RMS values, but they may alternatively be any other measure of voltage and current, such as peak, average, etc.

At various times that are highlighted in FIG. 3, the line current $I_{line}$ changes ('current transition'). If we adopt a notation of V' and I' being voltage and current measurements at a moment in time before a transition and V" and I" being voltage and current measurements at a moment in time after a transition, according to Ohm's law we can arrive at the following:

$$V'_P = V'_S - V'_{line}$$
$$V''_P = V''_S - V''_{line}$$
$$I'_{line} = \frac{V'_{line}}{X_{line}}$$
$$I''_{line} = \frac{V''_{line}}{X_{line}}$$

Therefore, assuming that $V_s$ remains substantially constant (i.e., V's and V"s are both substantially equal to $V_s$):

$$V_s = V'_P + I'_{line} \cdot X_{line} \quad V_s = V''_P + I''_{line} \cdot X_{line}$$

Therefore:

$$V'_P + I'_{line} \cdot X_{line} = V''_P + I''_{line} \cdot X_{line}$$
$$\frac{V'_P - V''_P}{I'_{line} - I''_{line}} = \frac{\Delta V_P}{\Delta I_{line}} = X_{line}$$

Therefore:

$$X_{line} = \left| \frac{\Delta V_P}{\Delta I_{line}} \right|$$
$$X_{line} = \left| \frac{V'_P - V''_P}{I'_{line} - I''_{line}} \right|$$

Therefore, it is possible to determine $X_{line}$ by determining $V_P$ using the voltage measuring device 210 and determining $I_{line}$ using the current measuring device 220 at a first time (i.e., V'$_A$ and I'$_{line}$) and determining $V_P$ using the voltage measuring device 210 and determining $I_{line}$ using the current measuring device 220 at a second time when $I_{line}$ has changed (i.e., V"$_A$ and I"$_{line}$). An example of the first time and the second time are represented in FIG. 3.

The moment at which to take the second reading (i.e., the second time) of $V_P$ and $I_{line}$ may be determined by monitoring $I_{line}$ to detect a change in current that is sufficiently large (for example, when a difference between $I_{line}$ and the measurement nine is greater than a predetermined threshold). Alternatively, first and second measurements of $V_P$ and $I_{line}$ may be periodically or intermittently taken, with each pair of I'$_{line}$ and I"$_{line}$ being compared. When the difference between a pair I'$_{line}$ and I"$_{line}$ is sufficiently large (for example, exceeding a predetermined threshold), that pair I'$_{line}$ and I"$_{line}$ and the corresponding pair V'$_P$ and V"$_P$ may be used to determine $X_{line}$.

Optionally, a time varying current signal (for example, an alternating current signal, or some other type of signal that changes over time) may be applied to the at least part of the electrical network so that the line current $I_{line}$ varies by a sufficient amount on a regularly basis in order to determine $X_{line}$ regularly. In this example, even where $I_{line}$ would otherwise remain relatively stable, $X_{line}$ may still be determined on a regular basis.

By taking the pair of voltage measurements determined using the same voltage measurement device and the pair of current measurements determined using the same current measurement device, any unique measurement device characteristics (for example, device gain, etc) may be cancelled out by the above process so that those characteristics do not affect the value determined for $X_{line}$. Furthermore, if the first time and the second time are relatively close together, any time-dependent non-idealities between the measurements (for example, gain drift, etc) may be minimised or eliminated. For example, the gain of each measurement device may drift with time and therefore be a potential source of error in the determination of impedance. Assuming that the gain changes relatively slowly (which can generally be assumed), any change in gain between the first and second measurements may be minimised by having the first time and second time relatively close together. By way of example, the first and second times may be within a predetermined time period of each other, which may be set to any suitable value (such as 0.5 seconds, 1 second, 5 seconds, 30 second, one minute, etc) depending on the level of accuracy required, the characteristics of the electrical network, the characteristics of the measurement devices, etc.

Another source of error is noise in the measurement devices, which may include thermal noise, quantisation and rounding. Some of these noise sources may be reduced by averaging multiple results together. Others may be reduced by waiting for a larger change in the current and voltage signal (i.e., using I'$_{line}$ and I"$_{line}$ that have a relatively large different). As such, the moment at which to take the reading(s) (i.e., the first time and/or second time) may be chosen in a way to balance each source of error to reduce the overall error in the result. As explained later, multiple determinations of $X_{line}$ over time may be averaged to reduce some of the sources of error. Optionally, it may also be possible to use some of the parameters from each set of measurements, such as one or more of: the gap between the first time and the second time; the amplitude of voltage change; the amplitude of current change; and/or the amplitude of a measurement of noise, to filter and/or weight the determinations of $X_{line}$ before averaging to produce an accurate final result.

In cases where V's cannot reasonably be assumed to equal V"s, $X_{line}$ may be determined by further measuring V's and V"s using a further voltage measuring device (which may be any suitable type of voltage measuring device arranged to measure $V_s$) and determining $X_{line}$ as follows:

$$X_{line} = \left| \frac{(V'_S - V'_A) - (V''_S - V''_A)}{I'_{line} - I''_{line}} \right|$$

In the above described processes, the impedance of the part of the network 'upstream' of point P can be determined. However, in a further example process, a specific section of the network 'upstream' of point P can be determined.

Figure 4:
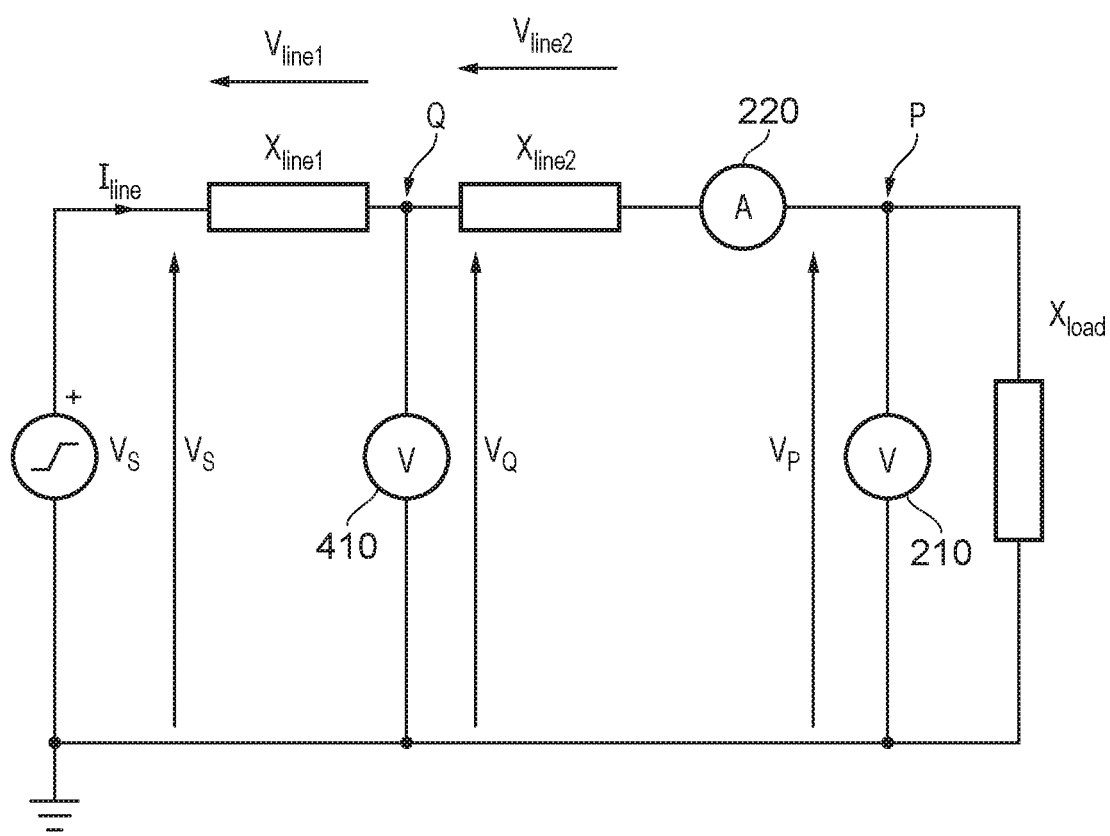
FIG. 4 shows a further simplified circuit representing part of the electrical power network of FIG. 1.

FIG. 4 shows a simplified circuit 400 representing part of the electrical network 100. The line impedance between point P and the voltage source has been divided into two series connected impedances—$X_{line1}$ and $X_{line2}$ each of which represents the impedance of a difference section of the electrical network between point P and the voltage source. A further voltage measurement device 410 may be used to determine the voltage at point Q relative to the reference voltage (in this example, ground). By determining a measurement of voltage at point P, $V_P$, the voltage at point Q, $V_Q$, and the line current $I_{line}$ at a first time and a second time (similarly to as described earlier with reference to FIG. 2), it is possible to determine a measure of $X_{line2}$. For example:

$$X_{line2}=(X_{line1}+X_{line2})-X_{line1}$$

($X_{line1}+X_{line2}$) represents the total impedance upstream of point P and may be determined by measuring $V_P$ and $I_{line}$ at the first time and the second time, as described above with respect to FIG. 2. $X_{line1}$ represents the total impedance upstream of point Q may be determined by measuring $V_Q$ and $I_{line}$ at the first time and the second time, using the analogous technique to that described above with reference to FIG. 2. Thus, the impedance of the network between point P and point Q may be determined by finding the difference between the impedance of the network upstream of point P and the impedance of the network upstream of point Q.

Therefore, $X_{line2}$ may be determined as follows:

$$X_{line2} = \left| \frac{V'_P - V''_P}{I'_{line} - I''_{line}} - \frac{V'_Q - V''_Q}{I'_{line} - I''_{line}} \right|$$

In this example, the voltage measurements taken at point Q are taken at the same time as the voltage measurements taken at point P. However, in an alternative, they may be taken at different times (for example, $V'_P$ may be taken at a 'first' time, $V''_P$ may be taken at a 'second' time, $V'_Q$ may be taken at a 'third' time, and $V''_Q$ may be taken at a 'fourth' time). The current measurements used to determine the impedance upstream of point P may be taken at the 'first' and 'second' times, and the current measurements used to determine the impedance upstream of point Q may be taken at the 'third' and 'fourth' times. A benefit of this approach is that time synchronisation between voltage measurements at points P and Q is not needed. A further benefit is that if one of the points sees more current change events than the other point, there may be more opportunities to determine impedance at that point. Those determined impedances may then be averaged to arrive at a more accurate measure of impedance upstream of that point.

Thus, it will be appreciated that the impedance of various different sections of the electrical network may be measured by determining the impedance at various different points using the techniques described above. By segmenting the electrical network in this way, the size of the part of the electrical network to which the determined impedance relates may be reduced. Consequently, any faults or impending faults in the electrical network that are indicated by the determined impedance may be physically found within the electrical network more quickly and easily.

Figure 5:
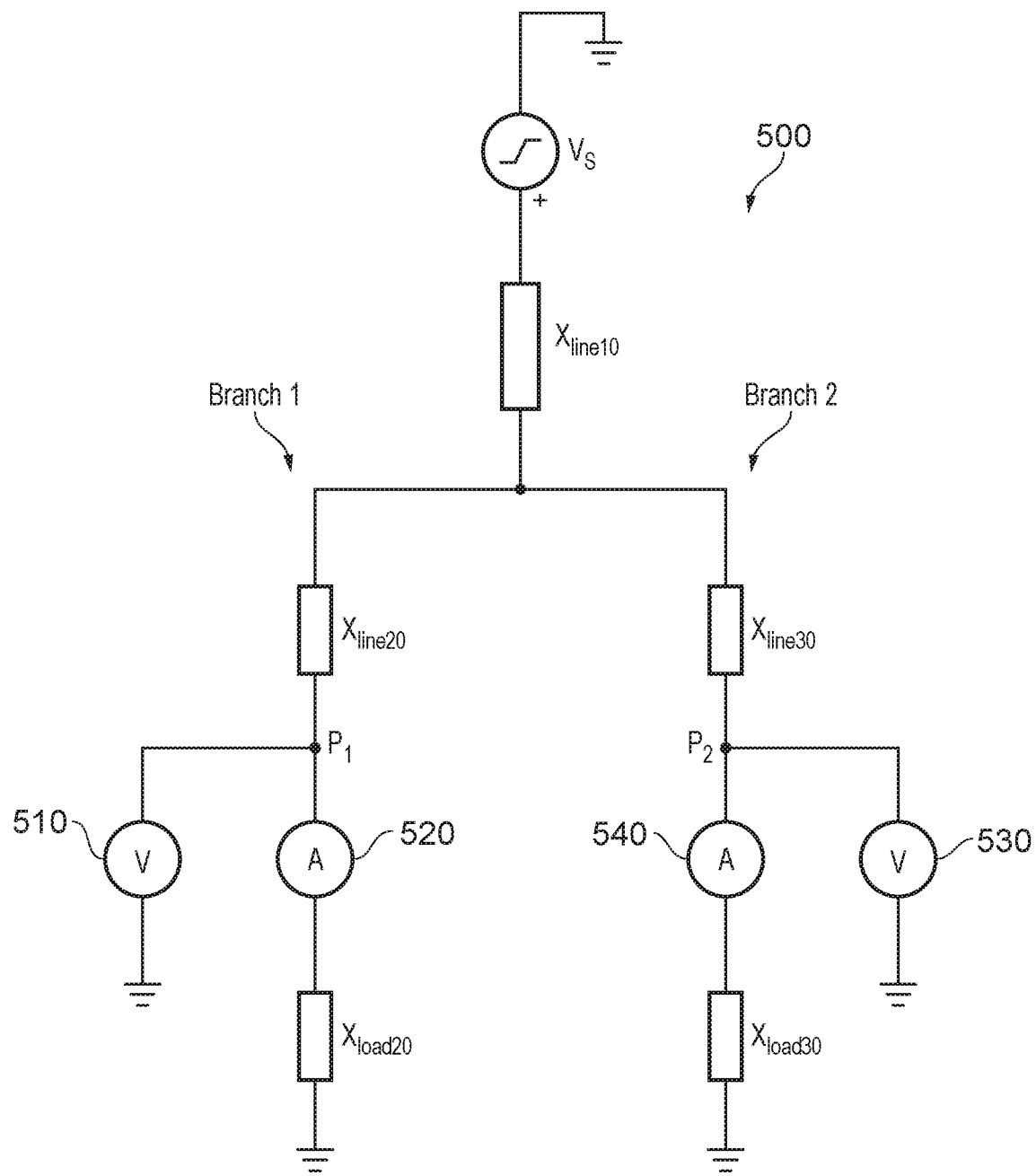
FIG. 5 shows a further simplified circuit representing part of the electrical power network of FIG. 1.

FIG. 5 shows a simplified circuit 500 representing a part of the electrical network 100 that has a branch. The impedance upstream of point $P_1$ may be determined using the voltage measurement device 510 and current measurement device 520 in accordance with the techniques described above. The impedance upstream of point $P_2$ may be determined using the voltage measurement device 530 and current measurement device 540 in accordance with the techniques described above. However, it should be noted that there is a root/trunk part of the electrical network that includes a common impedance, $X_{line10}$, shared by both branch 1 and branch 2. The common root part of the electrical network is the part of the electrical network from which the branch currents originate (i.e., a current flows through the root part and is then split, with part of the root current going to branch 1 and part of the root current going to branch 2). Faults in the electrical network may develop before and/or after the branch in the circuit and a change in the determined impedance upstream of $P_1$ or $P_2$ does not necessarily reveal whether the fault is before or after the branch. The represented loads $X_{load20}$ and $X_{load30}$ may be any form of load within the electrical network, for example servers if the electrical network is a data centre. They may be modelled as any form of load, for example an ohmic impedance, or a current source/sink (for example a current source/sink, which is the more likely type of load for the data centre example). Each of impedances $X_{line10}$, $X_{line20}$ and $X_{line30}$ may comprise electrical cabling and any other electrical components/devices between the loads and power supply. For example, referring back to the diagram of FIG. 1, PDU A may be coupled to an electrical bus-bar by electrical cabling. A first server ($X_{load20}$) may be coupled by the bus-bar by electrical cabling and a second server ($X_{load30}$) may be coupled by the bus-bar by electrical cabling. The impedance $X_{line20}$ may be the total impedance between the first server and common node of the branch network (which may include the impedance of the cabling between the first server and the bus-bar and the impedance of at least part of the bus-bar). The impedance $X_{line30}$ may be the total impedance between the second server and common node of the branch network (which may include the impedance of the cabling between the second server and the bus-bar and the impedance of at least part of the bus-bar). The impedance $X_{line10}$ may be the total impedance between the power supply and the common node of the branch network.

The inventors have recognised that monitoring each of $X_{line10}$, $X_{line20}$ and $X_{line30}$ may be beneficial in accurately monitoring the electrical network. For example, detecting a change in any of $X_{line10}$, $X_{line20}$ and $X_{line30}$ may be more useful for identifying and resolving problems in the electrical network compared with only being back to detect a change in $X_{line10}+X_{line20}$, or $X_{line10}+X_{line30}$. However, it is often very difficult to determine the voltage at the common node of the network, not least because it may be very difficult, if not impossible, to determine exactly where the common node physically is (for example, in the bus-bar example above). Furthermore, adding a voltage measurement device at or near the common node may be very difficult and may require invasive physical interference with the electrical network.

Therefore, the inventors have developed a number of different techniques for determining the common impedance $X_{line10}$ (also referred to as root or trunk impedance) and at least one of the branch impedances $X_{line20}$ and $X_{line30}$ without requiring a common node voltage measurement.

Branch Network (Zero Current Technique)

In a first technique, when the current in one branch, for example branch 1, is substantially zero (for example, is measured to be zero, or close to zero within an allowable threshold, by the current measurement device 520), the voltage drop across $X_{line20}$ will be negligible or zero. Consequently, a change in voltage at $P_1$ between the first measurement moment and the second measurement moment substantially equals the change in voltage across $X_{line10}$. This may be divided by a change in current measured at point $P_2$ (by current measurement device 540) between the first measurement moment and the second measurement moment, which substantially equals the change in current passing through $X_{line10}$. In particular:

$$X_{line10} = \left| \frac{V'_{10} - V''_{10}}{I'_{30} - I''_{30}} \right|$$

where $V'_{10}$ is a voltage measurement taken at point $P_1$ by the voltage measuring device 510 at a first moment in time (before a current change event), $V''_{10}$ is a voltage measurement taken at point $P_1$ by the voltage measuring device 510 at a second moment in time (after a current change event), $I'_{30}$ is a current measurement taken by the current measuring device 540 at the first moment in time and $I''_{30}$ is a current measurement taken by the current measuring device 540 at the second moment in time. By determining the common impedance $X_{line10}$, any detected changes in impedances upstream of point $P_1$ and/or $P_2$ may be attributed more accurately to an electrical network location either upstream or downstream of the branching point.

Branch Network (Simultaneous Technique)

In an alternative technique, the common impedance $X_{line10}$ may be determined by solving a set of simultaneous equations.

Figure 7:
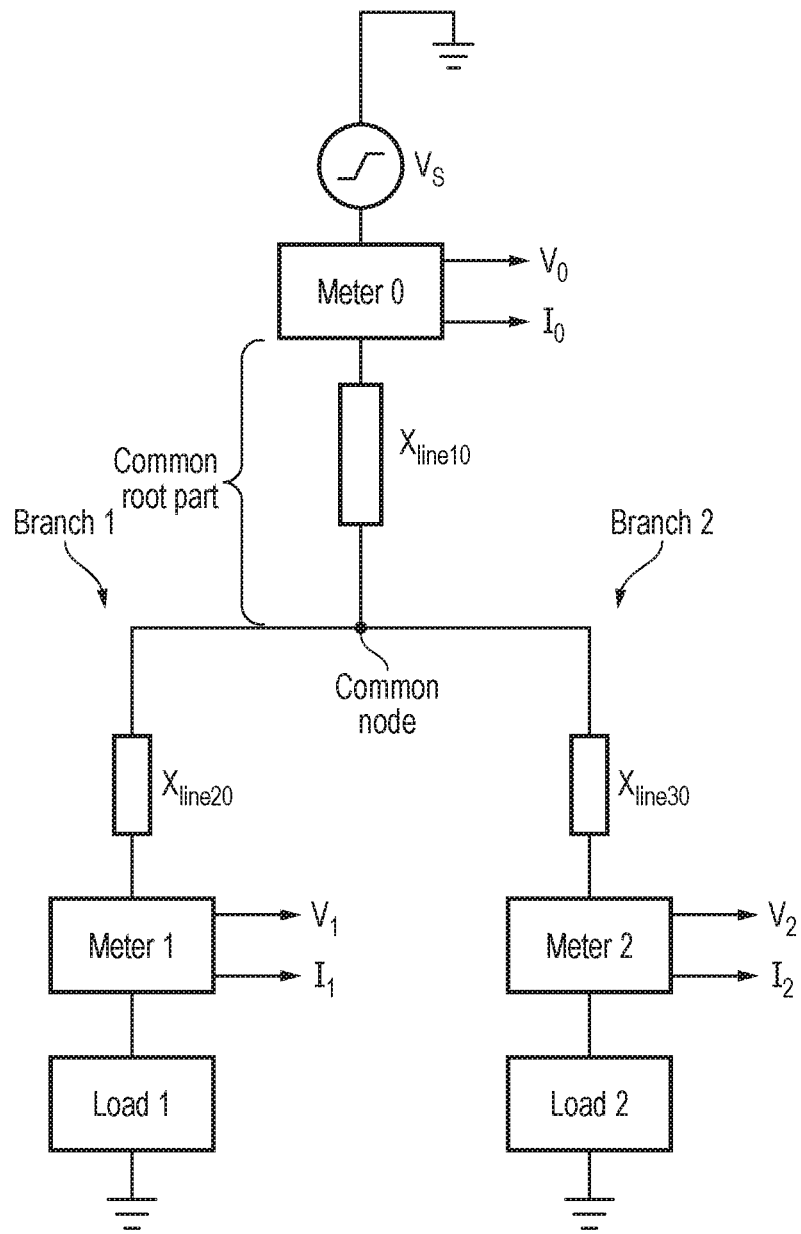
FIG. 7 shows an electrical network comprising a common root part and two branches, in accordance with as aspect of the present disclosure.

FIG. 7 shows a branch network that is very similar to that of FIG. 5, but includes an additional current measurement apparatus and an additional voltage measurement apparatus.

Figure 8:
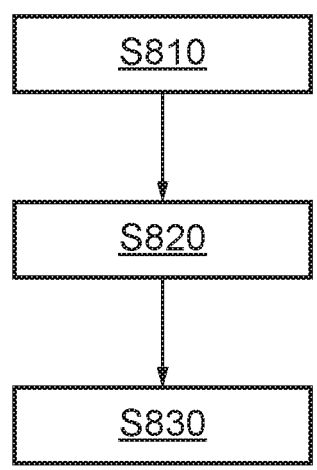
FIG. 8 shows example steps of a process for determining the impedances of the electrical network of FIG. 7.

FIG. 8 shows a representation of steps of the simultaneous technique in accordance with an aspect of the present disclosure. The steps may be performed by any suitable circuit/device/unit/module, for example the electrical network monitoring unit 610 described later (wherein the electrical network monitoring unit 610 is coupled to each of meters 0. 1 and 2 so as to receive the measures of current and voltage $I_0$, $V_0$, $I_1$, $V_1$, $I_2$, $V_2$ from the meters).

Meter 0 comprises a current sensor arranged to measure the current $I_0$ in the common root part of the electrical network. It also comprises a voltage sensor arranged to measure the voltage $V_0$ at the common root part of the electrical network relative to a reference potential, which in this example is ground (but could alternatively be any other suitable reference potential. For example, it could measure voltage between live and neutral). In the non-limiting example of FIG. 8, Meter 0 is coupled between the common root part and the source/input voltage to the electrical network such that Meter 0 measures the source/input voltage of the electrical network relative to the reference potential (put another way, Meter 0 is positioned 'upstream' of the common root impedance). However, in an alternative arrangement the point upstream of the common root impedance where Meter 0 is position may not be the input voltage point, for example one or more further devices/components/impedances may be arranged between Meter 0 and the voltage source. Meter 1 comprises a current sensor arranged to measure the current $I_1$ in the first branch of the electrical network. It also comprises a voltage sensor arranged to measure the voltage $V_1$ at the first branch. In the non-limiting example of FIG. 8, Meter 1 is positioned 'downstream' of the first branch impedance. Meter 0 and Meter 1 are arranged such that the common root impedance and the first branch impedance are between Meter 0 and Meter 1 and a difference between $V_0$ and $V_1$ (i.e., $V_0$-$V_1$) is the voltage across the first branch and the common root part (i.e., the voltage across the common root impedance, $X_{line10}$, and the first branch impedance, $X_{line20}$). Meter 2 comprises a current sensor arranged to measure the current $I_2$ in the second branch of the electrical network. It also comprises a voltage sensor arranged to measure the voltage $V_2$ at the second branch. In the non-limiting example of FIG. 8, Meter 2 is positioned 'downstream' of the second branch impedance. Meter 0 and Meter 2 are arranged such that the common root part and the second branch are between Meter 0 and Meter 2 and a difference between $V_0$ and $V_2$ (i.e., $V_0$-$V_2$) is the voltage across the second branch and the common root part (i.e., the voltage across the common root impedance, $X_{line10}$, and the second branch impedance, $X_{line30}$).

Whilst in the example represented in FIG. 8 there are three voltage sensors, in an alternative two voltage sensors may be used for determining the voltage across the first branch and the common root part, and the voltage across the second branch. More specifically, one voltage sensor could be arranged in the electrical network to measure the voltage across the first branch and the common root part and a further voltage meter could be arranged in the electrical network to measure the voltage across the second branch and the common root part. Furthermore, whilst in the example represented in FIG. 8 there are three current sensors, in an alternative two current sensors may be used for determining the current in the common root part, the first branch and the second branch. For example, one sensor may be positioned in the first branch to measure the current in the first branch, and a further sensor may be positioned in the second branch to measure the current in the second branch. The current in the common root part may then be determined by summing the two measured currents. In a further example, one sensor may be positioned in the common root part to measure the current in the common root part, and a further sensor may be positioned in the second branch to measure the current in the second branch. The current in the first branch may then be determined by differencing the two measured currents. It will be appreciated that this may be scaled up to any number of branches (for example, if there are four branches coupled to the common node, the required voltages may be determined using four or five voltage sensors, and the currents in all four branches and the common node may be determined using four or five current sensors). Thus, for the example electrical network of FIG. 8, the voltages may be determined by two or more voltage sensors arranged for determining the voltage across the first branch and the common root part, and the voltage across the second branch and the common root part. The currents may be determined by two or more current sensors positioned in at any two or more of the common root part, the first branch and/or the second branch.

In the data centre example represented in FIG. 2, the supply voltage Vs of FIG. 7 may be the power supply PDU A or PDU B, and Load 1 and Load 2 of FIG. 7 may each be a server within the data centre. However, it will be appreciated that the arrangement represented in FIG. 7 may be anywhere in any type of electrical network where there are two branches of the network both coupled to a common root part of the electrical network. Loads 1 and 2 may be modelled as current sources/sinks, or any other suitable form of load.

In Step S810, a plurality of electrical measurement data sets is be determined, each of which may comprise a measure of current through the common root part ($I_0$), a measure of current through the first branch ($I_1$), a measure of current through the second branch ($I_2$), a measure of voltage across the first branch and the common root part ($V_0$-$V_1$) and a measure of voltage across the second branch and the common root part ($V_0$-$V_2$). Each measure may be based on an instantaneous measurement from the meters, or an average of measurements from the meters, or a measure of change in voltage and current (as explained later). Therefore, it will be appreciated that the electrical network monitoring unit 610 may comprise memory for storing at least some of the current and voltage measurements received from the meters.

The electrical network may be modelled using Kirchoff's Voltage Law using the following simultaneous equations:

$$V_0 - V_1 = X_{line10} * I_0 + X_{line20} * I_1$$

$$V_0 - V_2 = X_{line10} * I_0 + X_{line30} * I_2$$

It can be seen that these simultaneous equations define a relationship between current, voltage and impedance of the first branch, second branch and common root part of the electrical network. However, there are three unknowns (the three impedances) and only two simultaneous equations. Therefore, the equations cannot be solved, since there will be multiple sets of impedance voltages that can satisfy the equations.

However, if two or more electrical measurements data sets (i.e. voltage and current measurements) are used, further equations may be added to the set of simultaneous equations, such that they may then be solved.

For example, using Meters 0, 1 and 2, we may determine a plurality of electrical measurement data sets as follows:

| Condition | Electrical measurement data set a | Electrical measurement data set b |
|---|---|---|
| V_SUPPLY | 230 V | 230 V |
| SERVER1 Load | 200 mA | 150 mA |
| SERVER2 Load | 300 mA | 450 mA |
| Meter 0 Readings | | |
| V0 | 230 V | 230 V |
| I0 | 500 mA | 600 mA |
| Meter 1 Readings | | |
| V1 | 229.93 V | 229.925 V |
| I1 | 200 mA | 150 mA |
| Meter 2 Readings | | |
| V2 | 229.83 V | 229.76 V |
| I2 | 300 mA | 450 mA |

The above measurements are by way of non-limiting example only. Data set a is taken when Load 1 and Load 2 are at a particular level, such that they are each sinking a particular amount of current. Data set b is taken when Load 1 and Load 2 are at a different level, such that the amount of current they are each sinking has changed. The amount of current they are sinking has changed by a different relative amount such that data set a is linearly independent from data set b. This is merely one particular example of linear independence of data set a and data set b and linear independence may occur in many other circumstances, such as Load 1 only changing between data set a and data set b, or Load 2 only changing between data set a and data set b, or some other change anywhere in the electrical network between data set a and data set b that results in the current in one or more of: branch 1, branch 2 and/or the common root part changing in a linearly independent way between data set a and data set b.

As a result, in step S820, a set of simultaneous equations is defined using the plurality of electrical measurement data sets. The set of simultaneous equations can now include three (or optionally four) equations:

$$V_{0a} - V_{1a} = X_{line10} * I_{0a} + X_{line20} * I_{1a}$$

$$V_{0a} - V_{2a} = X_{line10} * I_{0a} + X_{line30} * I_{2a}$$

$$V_{0b} - V_{1b} = X_{line10} * I_{0b} + X_{line20} * I_{1b}$$

(optionally also $V_{0b} - V_{2b} = X_{line10} * I_{0b} + X_{line30} * I_{2b}$)

The simultaneous equations define a relationship define a relationship between current, voltage and impedance of the first branch, second branch and common root part of the electrical network in a way that is solvable.

Using the example data set a and data set b measurements given above, we arrive at:

$$0.07 = X_{line10} * 500 \text{ mA} + X_{line20} * 200 \text{ mA}$$

$$0.17 = X_{line10} * 500 \text{ mA} + X_{line30} * 300 \text{ mA}$$

$$0.075 = X_{line10} * 600 \text{ mA} + X_{line20} * 150 \text{ mA}$$

Each of the impedances may now be determined by solving the set of simultaneous equations.

In step S830, a measure of $X_{line10}$, $X_{line20}$ and $X_{line30}$ is determined by solving the simultaneous equations. It will be appreciated that the simultaneous equations may be solved in a variety of different ways. For example, they may be solved using substitution. Alternatively, they may be solved suing a matrix solution, for example as described here: https://en.wikipedia.org/wiki/System_of_linear_equations#Matrix_solution The matrix solution may be executed in many different ways, for example in software such as using the Python programming language with the numpy linalg.solve( ) function. For example, using the example data set a and data set b set out above, the numpy function may be used as follows:

```
import numpy
A=numpy.array([[0.5, 0.2, 0],
[0.5, 0, 0.3],
[0.6, 0.15, 0]])
B=numpy.array([0.07, 0.17, 0.075])
C=numpy.linalg.solve(A, B)
print(C)
```

The solution, C, in this example is [0.1 0.1 0.4] which represents the values $X_{line10} = 0.1\Omega$, $X_{line20} = 0.1\Omega$, $X_{line10} = 0.4\Omega$.

It will be understood that in the matrix solution example, the number equations in the set of simultaneous equations is equal to the number of impedances (unknowns) to be determined. However, in some alternative techniques that may be used to solve the simultaneous equations, additional equations may be included in the set of simultaneous equations. For example, the fourth optional equation identified earlier may be included. Additionally or alternatively further electrical measurement data sets may be included in the plurality of data sets, which could be used to increase the number of equations in the set of simultaneous equations (for example, if a third data set is determined, one or two further equations may be included in the set of simultaneous equations).

One such example of an alternative method of solving the simultaneous equations is using a Linear Least Squares (LLS) Solver. This method computes the solution with the smallest error given any number of input equations.

LLS is described here: http://en.wikipedia.org/wiki/Linear_least_squares

Any suitable LLS Solver may be used. For example, Python's NumPy's linalg.lstsq( ) function may be used, which is described here: https://numpy.org/doc/stable/reference/generated/numpy.linalg.lstsq.html The Python solver in turn uses LAPACK's xGELSD routine, described here: http://www.netlib.org/lapack/lug/node27.html#tabdrivellsq which ultimately uses the Singular value decomposition technique, described here: https://en.wikipedia.org/wiki/Singular_value_decomposition Using an LLS Solver means that the solution with the smallest error is determined, with the potential size of error also output along with the solution. Typically, the more equations that are entered into the LLS Solver, the more the accuracy of the solution improves. This means that the more electrical measurement data sets that are determined and input into the solver, the more the accuracy of the solution should improve. Furthermore, it may not be necessary to check the linear independence of data set a and data set b since the Solver will accept inputs that are not linearly independent. Instead data sets may continually be added to the Solver until the identified error of the solution is within acceptable, predefined limits. In this way, after Step S830 is complete, the process may return to S810 and continually repeat Steps S810-S830 in order to add more data sets to the determination process and refine the accuracy of the determined impedances. Typically, over time as more data sets are used, the likelihood that at least some of them are sufficiently linearly independent increases, which in turn increases the accuracy of the solution.

Therefore, using an LLS Solver to solve the simultaneous equations may be beneficial. Further benefits identified by the inventors include improved tolerance to noise in the meter measurements, because of the averaging effect of the LLS Solver to reduce the error in the solution.

The above described process enables the impedance of each part of the electrical network to be monitored over time, without requiring a meter connected at the common node of the electrical network. As a result, the impedances of each part may be determined more accurately and with fewer measurement meters than might otherwise be required. Furthermore, because of the location of the meters near to the loads and the voltage supply, they are relatively easy to position in the electrical network and to leave for an extended period of time without interfering with the operating of the electrical network. Furthermore, current changes that naturally occur within an electrical network may be utilised for the determination of impedances, without requiring the application of any artificial measurement signals.

In the above explanation, the electrical circuit comprises a common root part and two branches. The process of impedance determination is configured to determine the impedances of all three parts $X_{line10}$, $X_{line20}$ and $X_{line30}$. However, in an alternative, the impedance determination process may be configured to determine the impedance of any one or more of the three parts. For example, the process may be configured to determine impedance $X_{line10}$ and/or $X_{line20}$ and/or $X_{line30}$. In a further alternative, the electrical network may comprise more than two branches coupled to the common root part at the common node. A meter may be included in any two or more of those branches and arranged to measure the current in the branch and the voltage at the branch relatively to the reference potential, such that the impedance of those branches may be determined in accordance with the process described above. Thus, it will be appreciated that the above described process may be extended to an electrical network with any number of branches coupled to a common root part at a common node.

In the electrical network represented in FIG. 8 the common root part is at a higher voltage potential than the branches, such that the common root part current splits at the common node and flows to the first and second branches. However, the above described technique may be used for an electrical network where the branches are at higher potential than the common root part, such that the branch currents combine at the common node and flow to the common root part.

In the above explanation of the simultaneous technique, the measures of current and voltage are typically spot/instantaneous measurements or samples (for example, measurements of DC current and voltage taken by the meters, or measurements of RMS, or peak, current and voltage where the meters are measuring AC signals).

However, in an alternative, each measure of current and voltage in the electrical measurement data sets may be a measure of change in current or voltage. In the example given earlier with reference to FIG. 7, each electrical measurement data set may comprise: $\Delta V_0$, $\Delta I_0$, $\Delta V_1$, $\Delta I_1$, $\Delta V_2$ and $\Delta I_2$. As such, a plurality of spot/instantaneous measurements from each meter in the electrical network may be used to determine each electrical measurement data set.

There are many different ways in which such a difference may be determined. For example, two spot measurements/samples, each taken at a different time, may be read from each meter and the difference between the two determined in order to generate an electrical measurement data set. In an alternative, the electrical network may be monitored to detect a transition in the current in the electrical network (for example, in the common root part and/or branch 1 and/or branch 2) and then determine the changes in currents and voltages corresponding to that transition. The transition may be caused by any suitable change in the conditions of the electrical network, for example Load 1 and/or Load 2 changing so as to draw a different level of current. It will be appreciated that in a data centre, the current draw of servers changes quite regularly, which may cause transitions in current in at least some parts of the electrical network.

Techniques for transition detection are described later. The electrical network monitoring unit 610, for example, may be configured to monitor for a transition at a step prior to step S810. When a transition is detected, process may then proceed to step S810 for determination of an electrical measurement data set, for example using measures of current and voltage from before and after the transition and that are stored in memory. The process may then return to monitoring for a transition and, when a further transition is detected, a further electrical data set may be determined. When sufficient electrical data sets are determined, the process may move on to Step S820.

When a transition is detected, the measures of change may be determined by finding the difference between one instantaneous measurement of current and voltage from each meter from before the detected transition and one instantaneous measurement of current and voltage from each meter from after the detected transition. Alternatively, when a transition is detected, the measures of change may be determined by finding the difference between an average of two or more instantaneous measurement of current and voltage from each meter from before the detected transition and an average of two or more instantaneous measurement of current and voltage from each meter from after the detected transition.

Transition Detection

A transition (also referred to as 'a step') in current in at least one part of the electrical network may be detected in a number of different ways. In one non-limiting example, with reference to FIG. 7, current measurements from one or more of meters 0, 1 and/or 2 may be monitored. The measurements may be cross-correlated with a unity NRZ step function (the length of the step function may be set to any suitable length, for example in consideration of the sample rate of the system and/or the typical rate of change of the sampled current signal). The magnitude of each peak in the cross-correlation function may be proportional to the size and shape of any changes in current. The electrical network monitoring unit 610 may, for example, perform this detection process.

Figure 9:
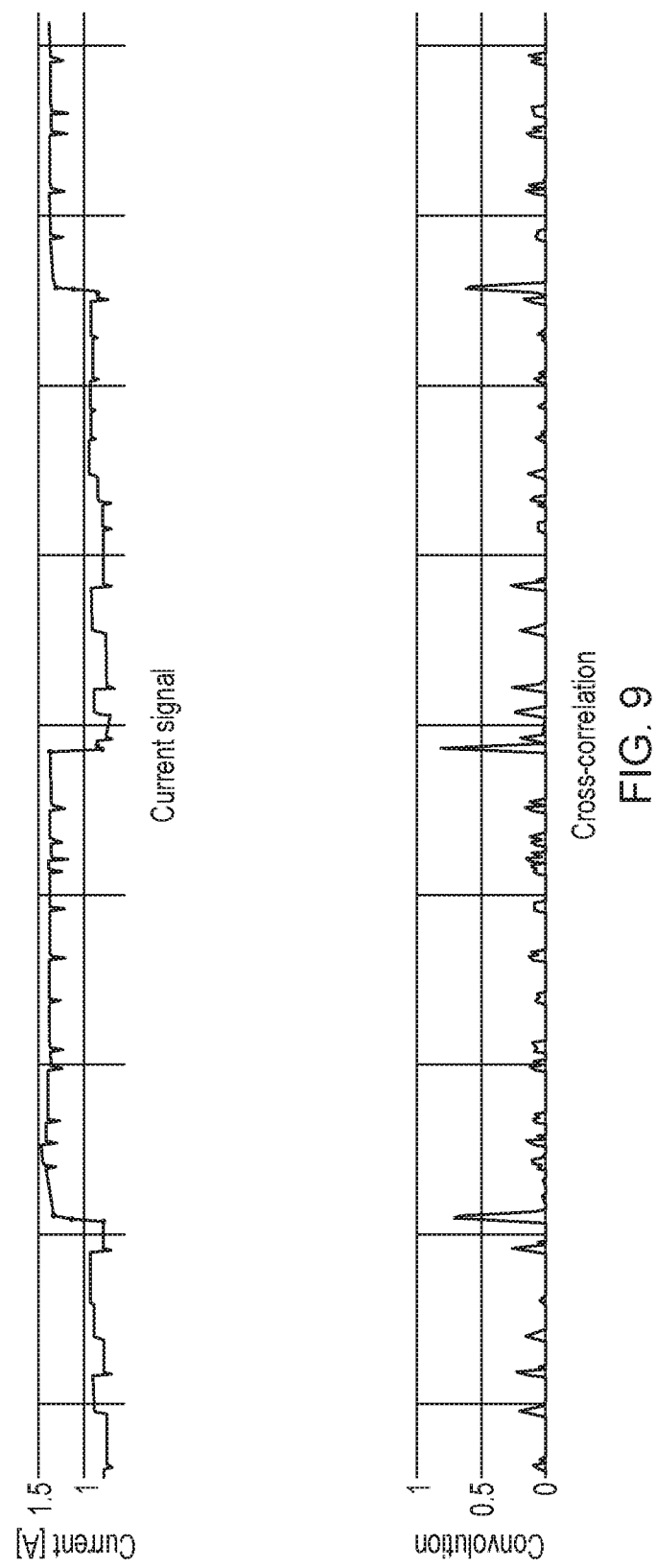
FIG. 9 shows a visualisation of an example technique for detecting transitions in current.

FIG. 9 shows an example of a measured current signal (for example, current $I_1$ measured by meter 1, or current $I_2$ measured by meter 2) and the cross-correlation of the signal. It can be seen that both increases and decreases in the current signal result in peaks in the cross correlation function. As can also be seen, larger transitions/steps in current result in larger peaks in the cross correlation function.

Optionally, a transition may be detected when a cross-correlation peak exceeds a pre-determined transition threshold. In this case, a peak detection function may be applied to the cross-correlation function, for example filtering the cross-correlation function with a threshold based on the pre-determined transition threshold. The pre-determined transition threshold may be set at any suitable value, for example based on the typical changes in current expected in the electrical network, the number of electrical measurement data sets desired over a period of time, the sample rate of the system, etc. For example, by setting the pre-determined threshold relatively high, the quality of measures within the electrical measurement data set may be improved, since measures of larger changes in current tend to improve the quality of impedance determination that is made using the data sets. However, larger thresholds tend to result in fewer data sets being determined.

Whilst a time varying current signal may be applied to the electrical network to cause transitions to take place, typically many electrical networks (particularly data centres with servers changing current loads regularly) may naturally experience current transitions. Therefore, the above described process can be performed on an electrical network that is simply operating as usual, without the requirement to apply specific additional signals to the network.

Resistive Heating

Conductor temperature may be a factor in conductor impedance. For example, the temperature coefficient of electrical resistance for copper, α, is 0.00323/° C., or a resistance change of about 0.3% for each ° C. of temperature change. The effect of temperature change may be determined by the following equation:

$$R_2 = R_1[1 + \alpha(T_2 - T_1)]$$

where $R_1$ is the resistance (Ω) at temperature $T_1$ and $R_2$ is the resistance at temperature $T_2$. $T_1$ may be referenced at 75° C.

Resistive heating is a process by which electrical current passing through a conductor produces heat. An increment in temperature due to the passage of electric current may induce an increment in the impedance of the conductor, which in turn may change the impedances determined using the processes described above.

In order to distinguish a change in impedance caused by self heating from a change in impedance caused by a fault developing in the electrical network, the inventors have determined that an impedance tracker may be used that includes a thermal model of the part of the electrical network that is being monitored. Measurements of current made by the current measurement device(s) described above may be fed into the thermal model of the part of the electrical network. Measurements of temperature may also be fed into the thermal model so that an historical picture of the line currents and temperatures may be built up and, as a consequence, estimates of impedance caused by self heating can be made. Physical quantities such as one or more of ambient temperature, copper mass, airflow, copper-air thermal resistance may also be used to statically or dynamically adapt the model to the real environment. The thermal model may be kept by the electrical network monitoring unit 610 described below, or by any other suitable entity, and may be used to refine the impedances determined according to the processes described above in order to develop a more accurate understanding of the impedances of the electrical network and whether any changes in impedance are likely to have been caused by a fault/impending fault in the network.

Figure 6:
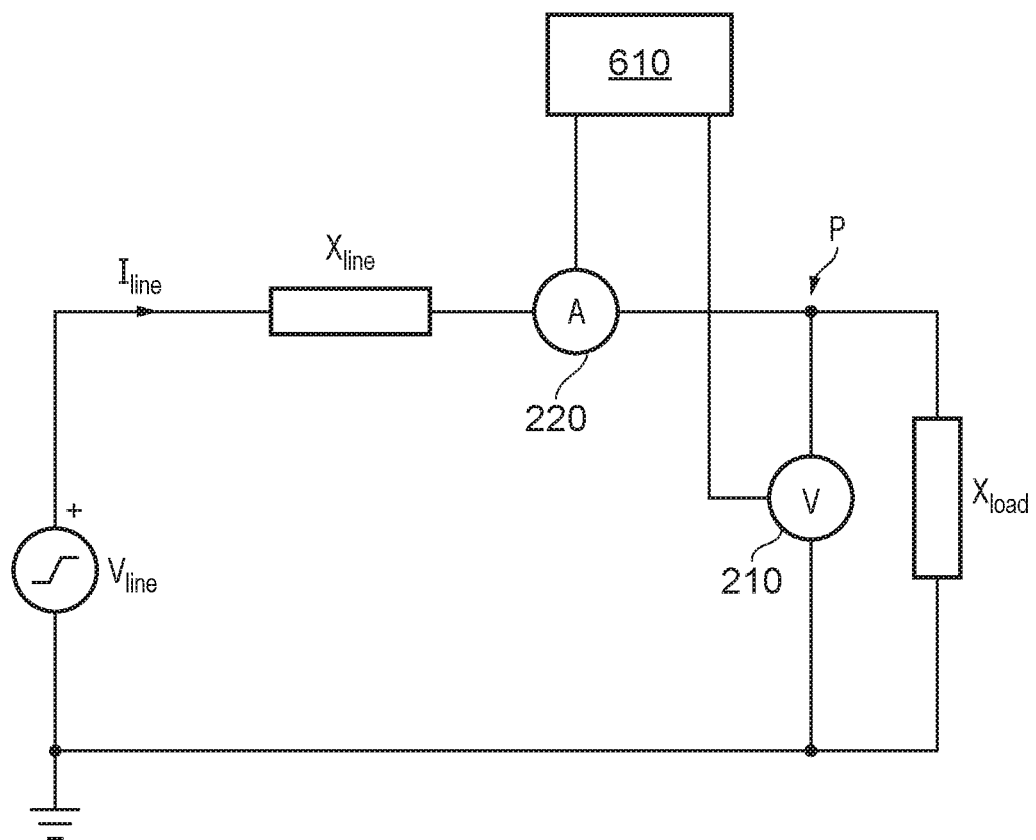
FIG. 6 shows a highly schematic representation of a system for use with an electrical network.

FIG. 6 shows a highly schematic representation of a system in accordance with an aspect of the present disclosure. The system comprises an electrical network monitoring unit 610 that is coupled to the first voltage measurement device 210 and the current measurement device 220. Optionally, the monitoring unit 610 may also be coupled to a further voltage measurement device, such as voltage measurement device 410, but this is not represented in FIG. 6 for the sake of simplicity. Further optionally, the electrical network monitoring unit 610 may be used with the electrical network represented in FIG. 7 and coupled to each of the meters 0, 1 and 2 and be configured to measure voltages and currents $V_0$, $I_0$, $V_1$, $I_1$, $V_2$, $I_2$. As explained earlier, the voltage measurement device 210, or meters 0, 1 and 2, may comprise any suitable form of voltage measurement device, such as voltage measuring ADCs configured to measure voltage relative to a reference level, such as ground. The current measurement device 220, or meters 0, 1 and 2, may likewise comprise any suitable form of current measuring device configured to measure the current. They may comprise, for example, a current transformer or current shunt.

The electrical network monitoring unit 610 may be any suitable form of unit/module/device configured to determine the impedance of at least part of the electrical network using one or more of the techniques described above. The electrical network monitoring unit 610 may monitor the condition of the electrical network by determining, over time, a plurality measurements of impedance of a part of the electrical network. It may determine if there is a fault in the network based on the measured impedance, for example by comparing the measurements against a maximum threshold impedance and/or minimum threshold impedance, and/or by considering a percentage change in measured impedance over time, and/or by considering a rate of change (or any other transient characteristic) of measured impedance over time, etc. In particular, the inventors have recognised that changes in impedance may be indicative of a fault, or impending fault, in a component in the electrical network, such that a measured impedance that is greater than the maximum threshold and/or less than the minimum threshold may be indicative of a fault or impending fault. The electrical network monitoring unit 610 may be configured to generate an electrical network condition report based on the measurements of impedance. For example, the report may comprise at least some of the measurements and/or an overall status condition report. If a potential fault is detected by the electrical network monitoring unit 610, the report may comprise an indication of that fault, for example indicating the section of the electrical network at which the fault is determined to have occurred (particularly where the electrical network monitoring unit 610 is configured to monitor impedances at a number of different parts of the electrical network). The electrical network monitoring unit 610 may be configured to output the report to any other module/entity, via any suitable communications medium.

The electrical network monitoring unit 610 may be implemented by a suitably configured electrical circuit, or by software, hardware or a combination of software and hardware. By way of example, the electrical network monitoring unit 610 may be implemented by a microcontroller. The functionality of the electrical network monitoring unit 610 may be implemented by software comprising computer readable code, which when executed on the processor of any electronic device (such as a computing device), performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives. The computer-readable medium may be distributed over network-coupled computer systems so that the computer readable instructions are stored and executed in a distributed way. The electrical network monitoring unit 610 may comprise memory, such as volatile or non-volatile memory (eg, RAM, DRAM, SRAM, ROM, Flash, etc) for storing any required data, such as voltage and/or current measurements for use in the processes described above, such as that described with reference to FIG. 8. It may also comprise one or more processors configured to execute the processes described above, such as that described with reference to FIG. 8.

Whilst the measurement devices 210 and 220 (and also 410, 510, 520, 530 and 540, and Meters 0, 1 and 2) may be separate from the electrical network monitoring unit 610, in an alternative implementation one or more of them may form part of the electrical network monitoring unit 610.

The electrical network monitoring unit 610 may be a single standalone unit, or may be a functional module within a larger unit (for example, within a microcontroller), or may be formed by two or more different units that are interconnected to perform the functionality described above.

Using the above described techniques, the impedance of one or more parts of an electrical network may be repeatedly determined over time. In one example, some of these repeated measurements may be used to determine an average impedance, for example a moving average based on the preceding n measurements, so that any measurement noise, etc may be mitigated, but genuine changes in impedance over time detected.

It will be appreciated that where terminology throughout this disclosure, 'first', 'second', 'third', 'fourth', etc, terminology is used. This terminology is used merely for identification purposes and does not necessarily imply an order in which processes should be performed, or particular positions of components or points within a circuit. For example, the positioning of the 'first' point P and the 'second' point Q in FIG. 4 could be switched over, such that the 'first' point P is closer to the supply than the 'second' point Q.

The terminology 'coupled' or 'electrically coupled' encompasses both a direct electrical connection between devices/components and an indirect electrical connection between devices/components (for example, an electrical connection between two components that is made via one or more further devices or components).

The present disclosure includes a system comprising the electrical network monitoring unit 610 and meters 0, 1 and 2 of FIG. 7. It will be appreciated that this system may be arranged within an electrical network in order to determine and monitor one of more impedances of the electrical network. However, it will also be appreciated that the electrical network monitoring unit 610 may be a standalone component/unit that is designed to be coupled to appropriate voltage and current meters that exist within an electrical network.

Further Disclosures

Figure 10:
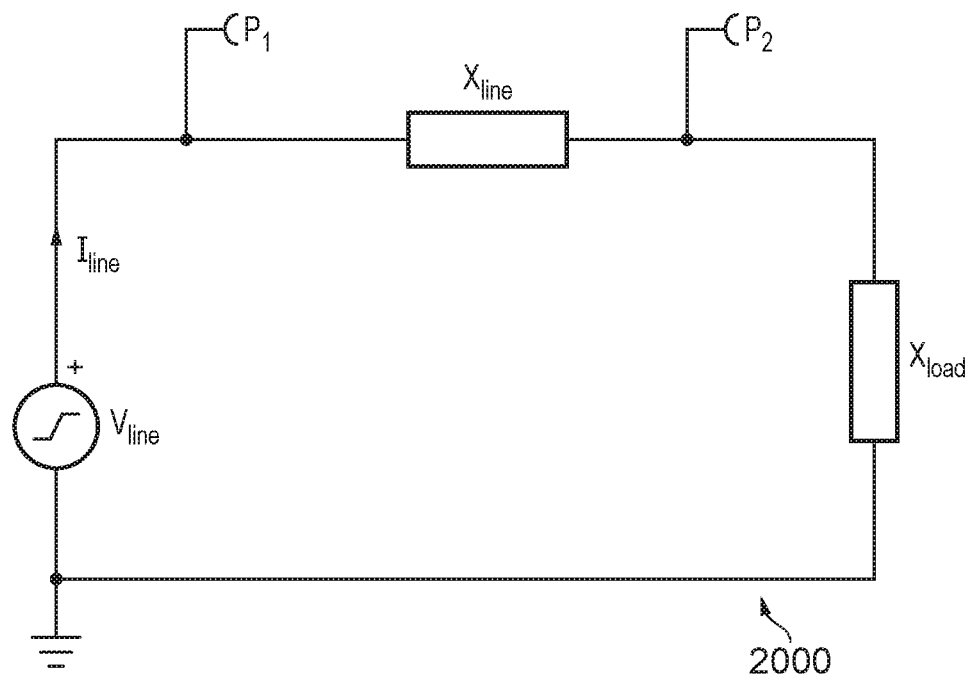
FIG. 10 shows a further simplified circuit representing part of the electrical power network of FIG. 1.

FIG. 10 shows a simplified circuit 2000 representing part of the electrical network 100. The simplified circuit 200 shows a line voltage source $V_{line}$, representing the voltage supplied to the electrical network, and a line current $I_{line}$, representing the AC current carried in the electrical network between the first point $P_1$ and the second point $P_2$.

The line impedance $X_{line}$ represents the total impedance of the electrical network between the first point $P_1$ and the second point $P_2$. The line impedance $X_{line}$ represents the combined impedance of all components and elements between the first point $P_1$ and the second point $P_2$, for example switches, wiring, etc. The line impedance $X_{line}$ may comprise a resistance component and/or a reactance component caused by capacitance and/or inductance between the first point $P_1$ and the second point $P_2$.

The load impedance $X_{load}$ represents the combined impedance of all components and elements downstream of the second point $P_2$ (for example, the servers in the example of FIG. 1) and may comprise a resistance component and/or a reactance component caused by capacitance and/or inductance downstream of the second point $P_2$.

In the explanation below, a first voltage measurement apparatus is used to measure a voltage at the first point $P_1$ and a second voltage measurement apparatus is used to measure a voltage at the second point $P_2$. These voltage measurements may be with respect to a reference voltage, for example ground. The first voltage measurement apparatus and the second voltage measurement apparatus may be any suitable type of voltage measurement apparatus that will be well known to the skilled person.

The line impedance $X_{line}$ may be determined using the following equation:

$$X_{line} = \frac{V_A - V_B}{I_{line}}$$

where $V_A$ is the voltage at the first point $P_1$ at a particular moment in time, $V_B$ is the voltage at the second point $P_2$ at the same particular moment in time and $I_{line}$ is the line current at the same particular moment in time.

However, the gain values of the first voltage measurement device and the second voltage measurement device are likely to be at least slightly different, even when the two measurement devices are of identical design. In some cases, particularly for relatively large electrical networks where the first point $P_1$ and the second point $P_2$ are a large distance apart, for example 10 s or 100 s of meters apart, the first and second voltage measurement devices may be a large distance apart, potentially at different temperatures, which may even further increase gain differences between them.

The voltage drop between the first point $P_1$ and the second point $P_2$ will often be very small. Therefore, any gain difference between the first and second voltage measurement devices may have a large effect on the accuracy of the determined line impedance $X_{line}$.

To demonstrate this, we will take an example network where the actual impedance $X_{line\_real}$ for a network is 1Ω, the actual line current $I_{line\_real}$ is 1 A, the actual voltage $V_{A\_real}$ is 230V and the actual voltage $V_{B\_real}$ is 229V. We will assume that the voltage measurement device measuring the voltage at point $P_1$ has a gain error of 1% and the voltage measurement device measuring the voltage at point $P_2$ has a gain error of 0%.

In this case, the measured voltage $V_A$ will be 230*1.01=232.3V and the measured voltage $V_B$ will be 229*1=229V. The determined value for $X_{line}$ will be:

$$X_{line} = \frac{V_A - V_B}{I_{line}}$$

$$X_{line} = \frac{232.3 - 229}{1}$$

$$X_{line} = 3.3\Omega$$

Therefore, it can be seen that only a 1% gain error on one of the voltage measurement devices has resulted in a 230% error in the determined value for $X_{line}$ compared with the actual impedance $X_{line\_real}$.

In view of this, the inventors have developed techniques to enable the voltage drop $V_A$-$V_B$ to be determined more accurately, meaning that the line impedance $X_{line}$ can be determined more accurately and the condition of the electrical network monitored more accurately.

Time Domain Technique

The inventors have realised that at the moment the AC current $I_{line}$ is zero, there should be no voltage drop between the first point $P_1$ and the second point $P_2$. Therefore, if a first measure of voltage can be determined that is indicative of the voltage at $P_1$ when $I_{line}$ is substantially zero and a second measure of voltage can be determined that is indicative of the voltage at $P_2$ when $I_{line}$ is substantially zero, any difference between the first measure of voltage and the second measure of voltage can be attributed to a gain difference between the first and second voltage measurement devices.

Figure 11A:
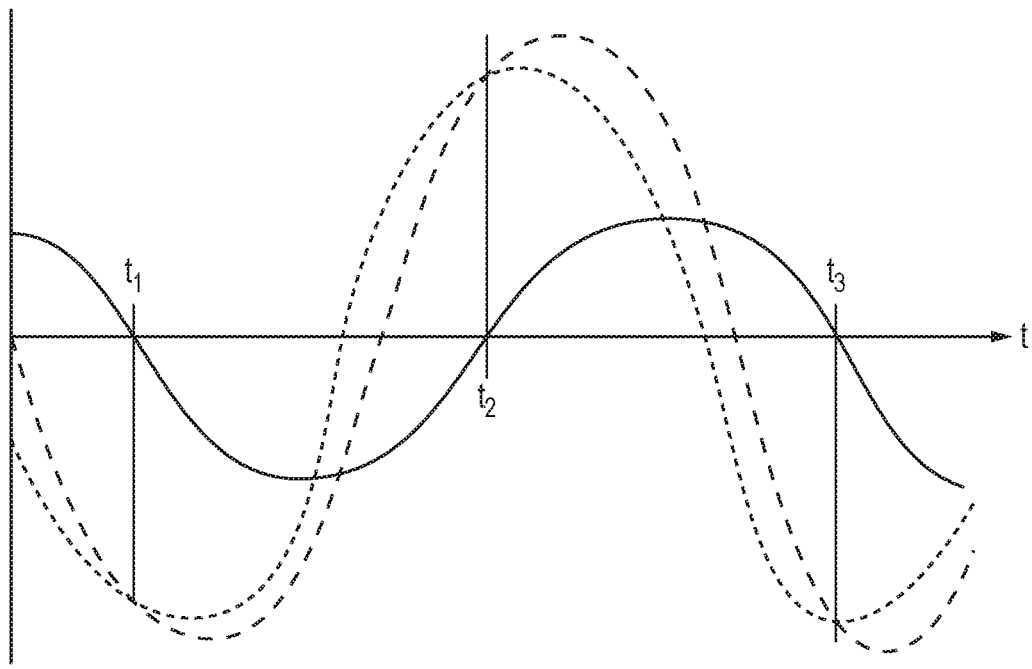
FIG. 11A shows an example representation of the AC current and AC voltages in the circuit of FIG. 10.

FIG. 11A shows a representation of the AC current $I_{line}$, the AC voltage at $P_1$ and the AC voltage at $P_2$, assuming that there is no gain difference between the first and second voltage measurement devices. At the moment $I_{line}$ is zero (t1, t2 and t3), it can be seen that the AC voltage at $P_1$ and the AC voltage at $P_2$ are equal. It will be noted that there is a phase difference between the signals, which is caused by reactance components within the electrical network.

Figure 11B:
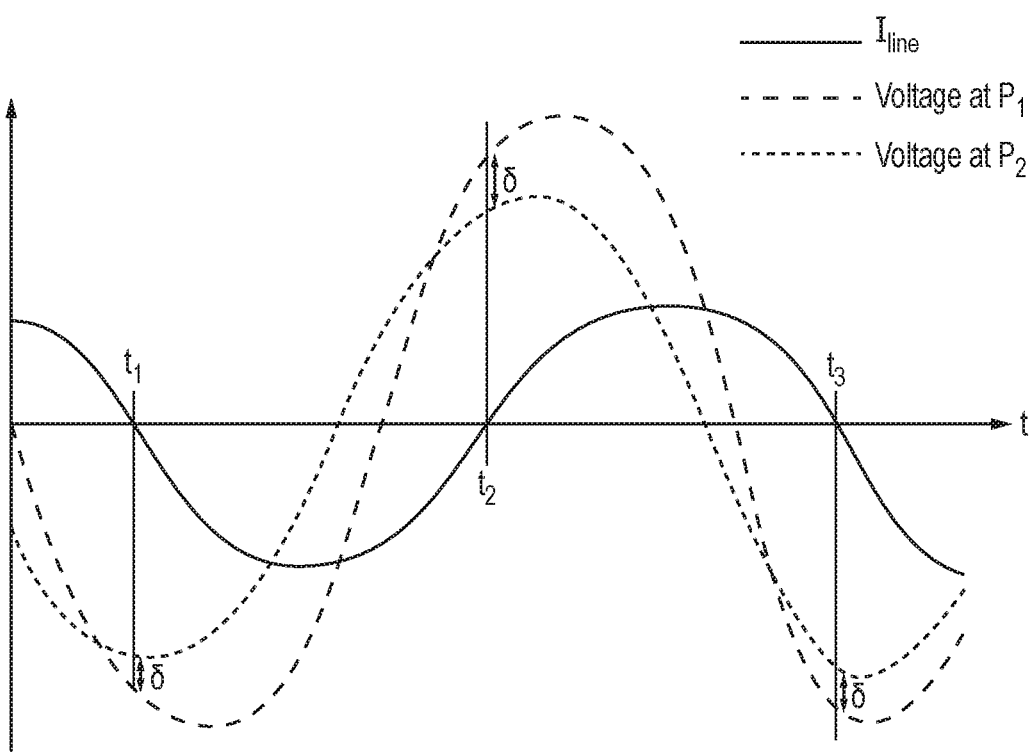
FIG. 11B shows a further example representation of the AC current and AC voltages in the circuit of FIG. 10.

FIG. 11B shows a representation of the AC current $I_{line}$, the AC voltage at $P_1$ and the AC voltage at $P_2$, where there is a gain difference between the first and second voltage measurement devices. As can be seen, at the moment $I_{line}$ is zero (t1, t2 and t3), there is a difference δ between the measured voltage at the first point $P_1$ and the measured voltage at the second point $P_2$. The inventors have realised that by determining this difference, a gain correction value may be determined and subsequently used to make a more accurate measure of line impedance $X_{line}$.

The first measure of voltage indicative of the voltage at $P_1$ when $I_{line}$ is substantially zero may simply be a voltage measurement taken by the first voltage measurement device at the moment $I_{line}$ is substantially zero (for example, a sample of the voltage signal measured by the first voltage measurement device at the moment $I_{line}$ is substantially zero). Likewise, the second measure of voltage indicative of the voltage at $P_2$ when $I_{line}$ is substantially zero may simply be a voltage measurement taken by the second voltage measurement device at the same moment (for example, a sample of the voltage signal measured by the second voltage measurement device at the moment $I_{line}$ is substantially zero). Alternatively, in consideration of the cyclical nature of the AC current $I_{line}$, a plurality of these voltage measurements may be taken over time and the first measure of voltage may be an average of the measurements taken by the first voltage measurement device and the second measure of voltage may be an average of the measurements taken by the second voltage measurement device.

The line current $I_{line}$ is 'substantially' zero when it is measured to be zero within the tolerances of the measurement devices. Therefore, 'substantially' zero is not necessarily exactly zero, but is zero to within device measurement tolerances (for example ±0.5%, ±1%, ±5% (depending on the device) and/or within the accuracy of interpolation techniques. For example, the line current may be measured by sampling it periodically or intermittently. Instances, the sampled current may be exactly 0 A, in which case the point in time of the sample may be used. However, the time at which the line current is exactly 0 A may fall between two samples, in which case the point in time at which the line current is 0 A may be estimated by interpolating between the two samples (for example, using linear interpolation and other more advanced interpolation techniques). The interpolated value would be the time at which the line current $I_{line}$ is 'substantially' zero. Whilst a single measurement may be used for each of the first and second measures of voltage, the averaging technique described above may be preferred owing to measurement and/or timing inaccuracies.

A gain correction value, α, may then be determined as a ratio of the first measure of voltage at $P_1$ and the second measure of voltage at $P_2$. For example:

$$\alpha = \frac{\text{First measure of voltage at } P_1}{\text{Second measure of voltage at } P_2}$$

To determine a more accurate measure of line impedance $X_{line}$, a third measure of voltage indicative of the voltage at $P_1$ when the current is substantially non-zero (for example, when $I_{line}$ is at a maximum or a minimum) and a fourth measure of voltage indicative of the voltage at $P_2$ when the current is substantially non-zero (for example, when $I_{line}$ is at a maximum or a minimum) is determined. The third measure of voltage may simply be a voltage measurement taken by the first voltage measurement device at a moment when $I_{line}$ is substantially non-zero, such as when it is at or near its maximum or minimum (for example, a sample of the voltage signal measured by the first voltage measurement device at the moment $I_{line}$ is at or near its maximum or minimum). Likewise, the fourth measure of voltage may simply be a voltage measurement taken by the second voltage measurement device at the same moment (for example, a sample of the voltage signal measured by the second voltage measurement device at the moment $I_{line}$ is at or near its maximum or minimum). Alternatively, a plurality of these voltage measurements may be taken over time and the third measure of voltage may be an average of the measurements taken by the first voltage measurement device and the second measure of voltage may be an average of the measurements taken by the second voltage measurement device.

A more accurate measure of voltage drop between $P_1$ and $P_2$ can then be determined using the third measure of voltage, the fourth measure of voltage and the gain correction value. For example, the voltage drop may be determined as follows:

Voltage drop=$V_3-\alpha V_4$ where $V_3$ is the third measure of voltage and $V_4$ is the fourth measure of voltage.

The line impedance $X_{line}$ may be determined from the determined voltage drop and a measure of the line current $I_{line}$ corresponding to the third and fourth measures of voltage. For example, the measure of line current $I_{line}$ may be a current measurement taken at the same moment that the third and fourth voltage measurements were made (for example, a sample of the current signal measured by a current measurement device in the circuit at the moment $I_{line}$ is at or near its maximum or minimum). Alternatively, it may be an average of a plurality of current measurements that were each taken at the same moment that each of the plurality of voltage measurements were taken by the first and second voltage measurement devices. $I_{line}$ impedance $X_{line}$ may then be determined as follows:

$$X_{line} = \frac{V_3 - \alpha V_4}{I_{line}}$$

The measurements $V_3$, $V_4$ and $I_{line}$ may be RMS measurements, or may be any other suitable measurements. For RMS measurements, the period over which the RMS is determined may be the same for $V_3$, $V_4$ and $I_{line}$. The measurement of voltage and current signals at different frequencies (for example, other than the 50 Hz or 60 Hz primary frequency of electrical power) may be used to determine the line impedance $X_{line}$ at other frequencies. For example, $V_3$, $V_4$ and $I_{line}$ may be amplitude measurements of a harmonic of the primary signal, in which case the line impedance at the harmonic frequency would be determined. Likewise, the gain correction value, $\alpha$, may be determined for different frequencies, although it may usually be expected for the gain correction value, $\alpha$, about be the same (or almost the same) for all frequencies of interest, in which case it may be determined once for the primary frequency and then used subsequently to determine the line impedance $X_{line}$ at all frequencies of interest.

Whilst a single measurement may be used for each of the third and fourth measures of voltage, and the measure of current, the averaging technique described above may be preferred owing to measurement and/or timing inaccuracies. Furthermore, whilst the example moment of measurement is when the line current $I_{line}$ is at, or close to, its maximum or minimum, in an alternative the measurements may be made at any other time when the line current $I_{line}$ is non-zero.

Thus, it can be seen that a more accurate measure of impedance between $P_1$ and $P_2$ can be determined, which means that the electrical network may be monitored more accurately and reliably and faults within the electrical network may be identified more accurately and reliably.

Frequency Domain Technique

Rather than using a time based technique, a frequency domain technique may be used to determine the first measure of voltage indicative of the voltage at $P_1$ when the AC current carried in the network is substantially zero and the second measure of voltage indicative of the voltage at $P_2$ when the AC current carried in the network is substantially zero. In this technique, a frequency domain representation of a first voltage signal measured by the first voltage measurement device, a frequency domain representation of a second voltage signal measured by the second voltage measurement device and a frequency domain representation of the AC current in the electrical network may be determined. For example, each of these time-domain signals may be transformed to the frequency domain using a Fast Fourier Transform (FFT), or any other suitable time to frequency domain technique.

The phase of the first voltage signal at the moment that the AC current signal is substantially zero may be determined by differencing the phase of the AC current (found from the frequency-domain representation of the AC current) and the phase of the first voltage signal (found from the frequency-domain representation of the first voltage signal). Thus, the phase of the first voltage signal at the moment that the AC current signal is substantially zero may be determined by finding the phase of the first voltage signal relative to the AC current signal. Likewise, the phase of the second voltage signal at the time that the AC current signal is substantially zero may be determined by differencing the phase of the AC current and the phase of the second voltage signal (found from the frequency-domain representation of the second voltage signal). Thus, the phase of the second voltage signal at the moment that the AC current signal is substantially zero may be determined by finding the phase of the second voltage signal relative to the AC current signal.

Whilst it may be possible directly to find the phase of the first voltage signal relative to the current signal and the phase of the second voltage signal relative to the current signal (for example, using frequency domain analysis), in practice, each of the first voltage signal, second voltage signal and the AC current signal may be sampled using a sample clock. Consequently, the phase of the AC current signal may be found relative to the sample clock by frequency transforming the AC current signal (for example, using FFT), the phase of the first voltage signal may be found relative to the sample clock by frequency transforming the first voltage signal (for example, using FFT) and the phase of the second voltage signal may be found relative to the sample clock by frequency transforming the second voltage signal (for example, using FFT). The phase of the first voltage signal relative to the current signal may then be found by differencing the phase of the first voltage signal relative to the clock signal and the phase of the current signal relative to the clock signal. The phase of the second voltage signal relative to the current signal may then be found by differencing the phase of the second voltage signal relative to the clock signal and the phase of the current signal relative to the clock signal. The phase of the clock signal is an arbitrary reference signal.

The peak amplitude of the first voltage signal may be determined from the first voltage signal using any standard technique well understood by the skilled person. Likewise, the peak amplitude of the second voltage signal may be determined from the second voltage signal using any standard technique well understood by the skilled person. Based on the peak amplitude and the earlier determined phase of the voltage signal at which the AC current is substantially zero, the amplitude of the voltage signals at the moment when the AC current is substantially equal to zero may be determined. For example, $$y_1 = A_1 \sin \varphi_1$$

$$y_2 = A_2 \sin \varphi_2$$

where $y_1$ is the amplitude of the first voltage signal at the moment when the AC current is substantially equal to zero, $y_2$ is the amplitude of the second voltage signal at the moment when the AC current is substantially equal to zero, $A_1$ is the peak amplitude of the first voltage signal, $A_2$ is the peak amplitude of the second voltage signal, $\phi_1$ is the determined phase of the first voltage signal at the moment that the AC current signal is substantially zero, and $\phi_2$ is the determined phase of the second voltage signal at the moment that the AC current signal is substantially zero.

Figure 13:
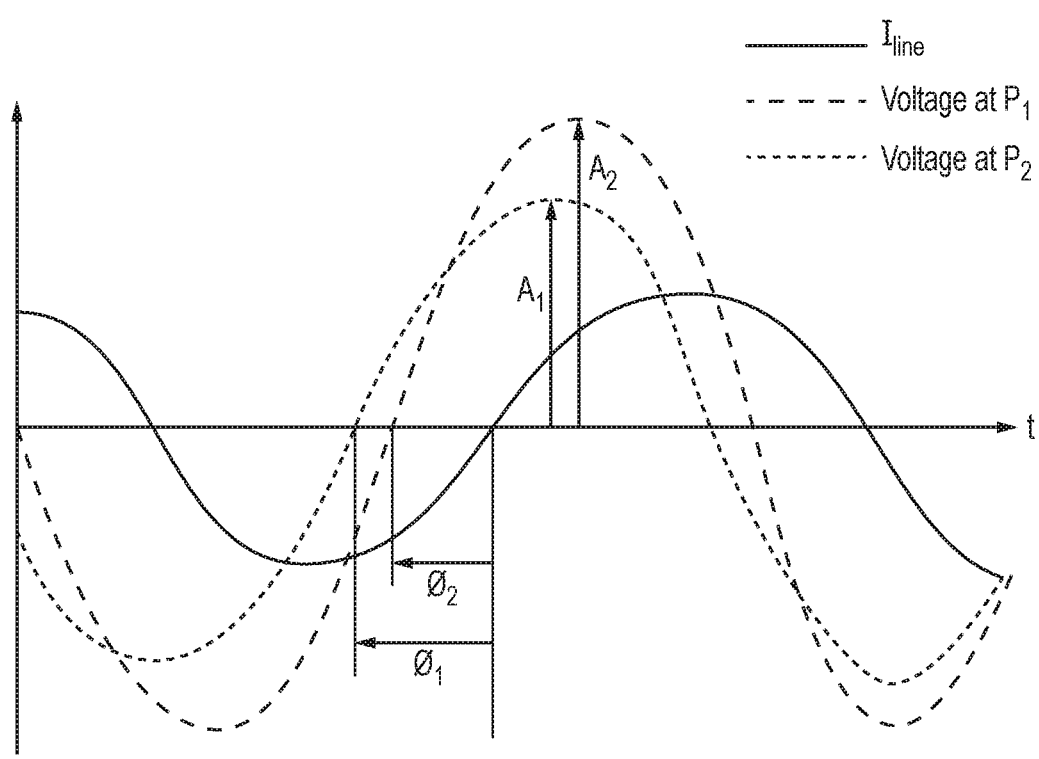
FIG. 13 shows an example representation of the AC current and AC voltages in the circuit of FIG. 10, demonstrating phase differences.

FIG. 13 shows a representation of the AC current $I_{line}$, the AC voltage at $P_1$ and the AC voltage at $P_2$ demonstrating $A_1$, $A_2$, $\phi_1$ and $\phi_2$. Whilst this figure shows the voltage signals lagging the current signal, it will be appreciated that in other electrical networks the voltage signals may lead the current signal (for example, depending on whether the line impedance X is capacitive or inductive).

Thus, the gain correction value, $\alpha$, may be determined similarly to the time-domain technique described earlier, for example as a ratio of $y_1$ and $y_2$. For example:

$$\alpha = \frac{y_1}{y_2}$$

An accurate determination of line impedance $X_{line}$ may then be made as described earlier with respect to the time-domain technique.

Whilst either the time-domain or the frequency domain could be used as alternatives, in a further implementation, both could be used. For example, a gain correction value could be determined using the time-domain technique and a further gain correction value could be determined using the frequency domain technique. The gain correction value $\alpha$ ultimately used to determine $X_{line}$ may then be an average of these two values, for example.

Figure 12:
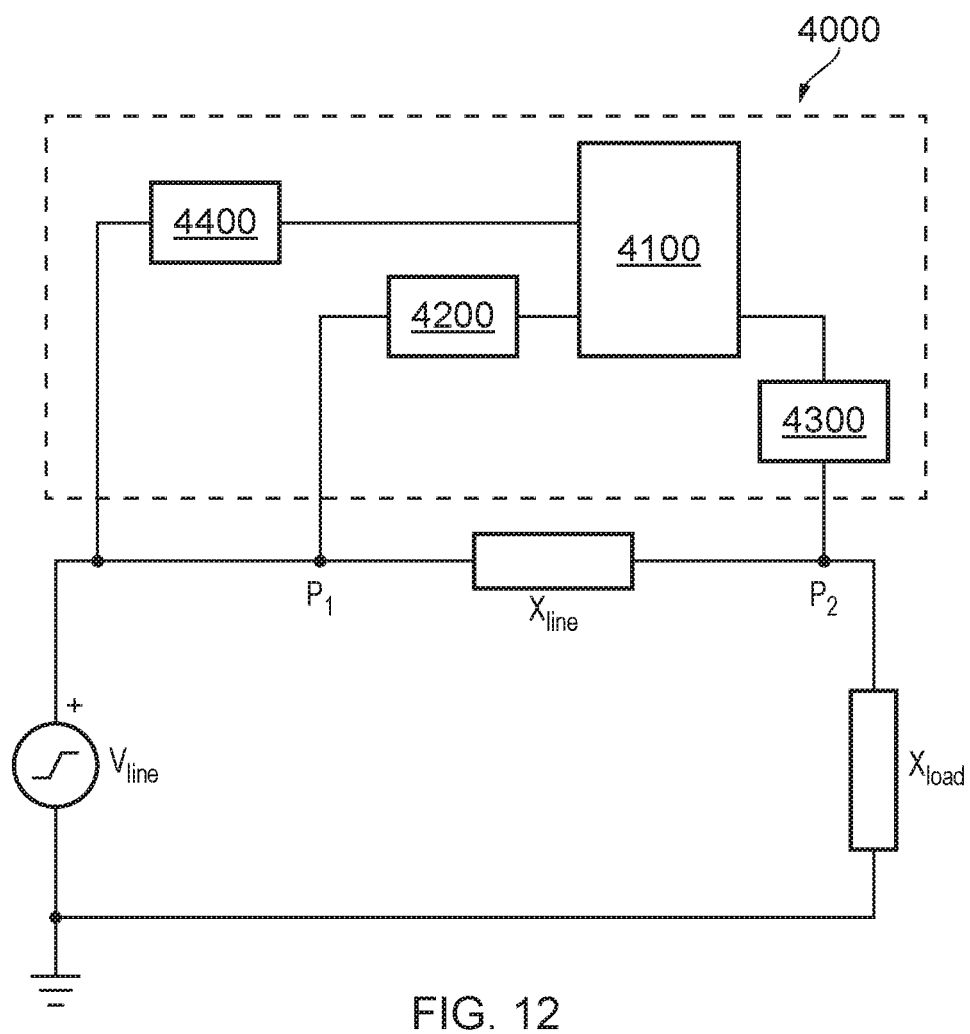
FIG. 12 shows a highly schematic representation of a system for use with an electrical network.

FIG. 12 shows a highly schematic representation of a system 4000 in accordance with an aspect of the present disclosure. The system 4000 comprises an electrical network monitoring module 4100 that is coupled to a first voltage measurement device 4200, a second voltage measurement device 4300 and a current measurement device 4400. As explained earlier, the first voltage measurement device 4200 and second voltage measurement device 4300 may be any suitable form of voltage measurement device, such as voltage measuring ADCs configured to measure voltage relative to a reference level, such as neutral. The current measurement device 4400 may likewise be any suitable form of current measuring device configured to measuring the AC current carried in the electrical network. A current sensing device, for example a current transformer or current shunt, may be connected in series anywhere in the electrical network (for example, at point $P_1$, at point $P_2$, between points $P_1$ and $P_2$, or anywhere else) in the electrical network for use in measuring current, but this is not represented in FIG. 12 for the sake of simplicity.

The electrical network monitoring module 4100 may be any suitable form of unit/module/device configured to determine the impedance between points $P_1$ and $P_2$ using one or more of the techniques described above. The electrical network monitoring module 4100 may monitor the condition of the electrical network by determining, over time, a plurality measurements of impedance between $P_1$ and $P_2$. It may determine if there is a fault in the network based on the measured impedance, for example by comparing the measurements against a maximum threshold impedance and/or minimum threshold impedance, and/or by considering a percentage change in measured impedance over time, and/or by considering a rate of change (or any other transient characteristic) of measured impedance over time, etc. In particular, the inventors have recognised that changes in impedance may be indicative of a fault, or impending fault, in a component in the electrical network, such that a measured impedance that is greater than the maximum threshold and/or less than the minimum threshold may be indicative of a fault or impending fault. The electrical network monitoring module 4100 may be configured to generate an electrical network condition report based on the measurements of impedance. For example, the report may comprise at least some of the measurements and/or an overall status condition report. If a potential fault is detected by the electrical network monitoring module 4100, the report may comprise an indication of that fault, for example indicating the section of the electrical network at which the fault is determined to have occurred (particularly where the electrical network monitoring module 4100 is configured to monitor impedances between a number of different points within the electrical network). The electrical network monitoring module 4100 may be configured to output the report to any other module/entity, via any suitable communications medium. The electrical network monitoring module 4100 may be configured to determine and monitor the impedance of two or more different sections of the electrical network by measuring voltage at many different points in the electrical network, in which case many different parts of the electrical network may be monitored such that potential faults in different part of the network may be detected.

The electrical network monitoring module 4100 may be implemented by software, hardware or a combination of software and hardware. By way of example, the electrical network monitoring module 4100 may be implemented by a microcontroller. The functionality of the electrical network monitoring module 4100 may be implemented by software comprising computer readable code, which when executed on the processor of any electronic device, performs the functionality described above. The software may be stored on any suitable computer readable medium, for example a non-transitory computer-readable medium, such as read-only memory, random access memory, CD-ROMs, DVDs, Blue-rays, magnetic tape, hard disk drives, solid state drives and optical drives. The computer-readable medium may be distributed over network-coupled computer systems so that the computer readable instructions are stored and executed in a distributed way.

Whilst the measurement devices 4200, 4300 and 4400 may be separate from the electrical network monitoring module 4100, in an alternative implementation one or more of them may form part of the electrical network monitoring module 4100.

The electrical network monitoring module 4100 may be a single standalone unit, or may be a functional module within a larger unit (for example, within a microcontroller), or may be formed by two or more different units that are interconnected to perform the functionality described above.

It will be appreciated that throughout this disclosure, 'first', 'second', 'third', 'fourth', etc, terminology is used. This terminology is used merely for identification purposes and does not imply an order in which processes should be performed, or particular positions of components or points within a circuit. For example, the positioning of the 'first' point $P_1$ and the 'second' point $P_2$ in FIG. 10 could be switched over, such that the 'first' point $P_1$ is at the load side of the line impedance $X_{line}$ and the 'second' point $P_2$ is at the voltage source side of the line impedance $X_{line}$.

The invention claimed is:

1. A system for determining an impedance of an electrical network, wherein the electrical network comprises a common root part, a first branch and a second branch, wherein the first branch and the second branch are both coupled to the common root part of the electrical network, the system comprising:
an electrical network monitoring unit configured to:
determine a plurality of electrical measurement data sets, each electrical measurement data set comprising: a measure of current through the common root part, a measure of current through the first branch, a measure of current through the second branch, a measure of voltage across the first branch and common root part, and a measure of voltage across the second branch and common root part;
define, using the plurality of electrical measurement data sets, a set of simultaneous equations that define a relationship between current, voltage and impedance of the first branch, the second branch, and the common root part; and
determine, by solving the set of simultaneous equations, one or more of: an impedance of the common root part, an impedance of the first branch, an impedance of the second branch.

2. The system of claim 1, wherein at least one of the electrical measurement data sets is linearly independent from at least one other of the electrical measurement data sets.

3. The system of claim 1, wherein each set of each electrical measurement data set corresponds to a different point in time.

4. The system of claim 3, wherein the measures of current and voltage in a first electrical data set of the plurality of electrical data sets are taken at a first point in time and the measures of current and voltage in a second electrical data set of the plurality of electrical data sets are taken at a second point in time, and wherein at least one of the following applies:
the current in the first branch at the first point in time is different to the current in the first branch at the second point in time;
the current in the second branch at the first point in time is different to the current in the second branch at the second point in time;
the current in the common root part at the first point in time is different to the current in the common root part at the second point in time.

5. The system of claim 4, wherein at least one of the following applies:
the current in the first branch at the first point in time is different to the current in the first branch at the second point in time by at least a current difference threshold;
the current in the second branch at the first point in time is different to the current in the second branch at the second point in time by at least a current difference threshold;
the current in the common root part at the first point in time is different to the current in the common root part at the second point in time by at least a current difference threshold.

6. The system of claim 1, wherein the measure of current through the common root part is a measure of change in current through the common root part, and wherein the measure of current through the first branch is a measure of change in current through the first branch, and
wherein the measure of current through the second branch is a measure of change in current through the second branch, and
wherein the measure of voltage across the first branch and common root is a measure of change in voltage across the first branch and common root part, and
wherein the measure of voltage across the second branch and common root is a measure of change in voltage across the second branch and common root part.

7. The system of claim 6, wherein the electrical network monitoring unit is further configured to:
detect a transition in the current that exceeds a current transition threshold in at east one of: the first branch, the second branch, the common root part; and
determine an electrical data set of the plurality of electrical data set to correspond to the detected transition, such that the measures of current and voltage in the electrical data set are indicative of the changes in current and voltage corresponding to the detected transition.

8. The system of claim 1, wherein the measure of voltage across the first branch and common root part is a difference between a voltage measurement taken at the common root part and a voltage measurement taken at the first branch, and
wherein the measure of voltage across the second branch and common root part is a difference between the voltage measurement taken at the common root part and a voltage measurement taken at the second branch.

9. The system of claim 1, wherein the electrical network monitoring unit is further configured to:
monitor a condition of at least part of the electrical network based on the determined one or more of: the impedance of the common root part, the impedance of the first branch, or the impedance of the second branch.

10. The system of claim 9, wherein monitoring the condition of at least part of the electrical network comprises determining whether or not a fault has occurred in the at least part of the electrical network.

11. The system of claim 10, wherein the electrical network monitoring unit is further configured to detect a fault in the common root part if at least one of the following conditions is met:
the measure of impedance of the common root part exceeds a maximum threshold value; or
the measure of impedance of the common root part is below a minimum threshold value.

12. The system of claim 10, wherein the electrical network monitoring unit is further configured to detect a fault in the first branch if at least one of the following conditions is met:
the measure of impedance of the first branch of exceeds a first branch maximum threshold value; or
the measure of impedance of the first branch is below a first branch minimum threshold value.

13. The system of claim 10, wherein the electrical network monitoring unit is further configured to generate an electrical network condition report based at least in part on the determined one or more of:
the impedance of the common root part, the impedance of the first branch, or the impedance of the second branch.

14. The system of claim 1, further comprising:
a first current sensor coupled to the electrical network monitoring unit and arranged to measure current in the first branch;

a second current sensor coupled to the electrical network monitoring unit and arranged to measure current in the second branch;

a third current sensor coupled to the electrical network monitoring unit and arranged to measure current in the common root part;

a first voltage sensor coupled to the electrical network monitoring unit and configured to measure a voltage at the first branch relative to a reference potential;

a second voltage sensor coupled to the electrical network monitoring unit and configured to measure a voltage at the second branch relative to the reference potential; and a third voltage sensor coupled to the electrical network monitoring unit and configured to measure a voltage at the common root part relative to the reference potential; and wherein the first voltage sensor and third voltage sensor are arranged such that a difference between the measured voltage at the common root part and the measured voltage at the first branch is the measure of voltage across the first branch and common root part of the electrical network, and wherein the second voltage sensor and third voltage sensor are arranged such that a difference between the measured voltage at the common root part and the measured voltage at the second branch is the measure of voltage across the second branch and common root part of the electrical network.

15. A method for determining an impedance of an electrical network, wherein the electrical network comprises a common root part, a first branch and a second branch, wherein the first branch and the second branch are both coupled to the common root part of the electrical network, the method comprising:

determining a plurality of electrical measurement data sets, each electrical measurement data set comprising: a measure of current through the common root part, a measure of current through the first branch, a measure of current through the second branch, a measure of voltage across the first branch and common root part, and a measure of voltage across the first branch and common root part;

defining, using the plurality of electrical measurement data sets, a set of simultaneous equations that define a relationship between current, voltage and impedance of the first branch, the second branch and the common root part; and determining, by solving the set of simultaneous equations, one or more of: an impedance of the common root part, an impedance of the first branch, or an impedance of the second branch.

16. An electrical network monitoring unit, configured to:
determine one or more measurements of impedance of at least part of an electrical network the electrical network comprising a common root part, a first branch, and a second branch, wherein the determining comprises:
defining a set of simultaneous equations that define a relationship between impedance of the first branch, the second branch and the common root part, and solving the set of simultaneous equations to determine one or more of: an impedance of the common root part, an impedance of the first branch, or an impedance of the second branch; and monitor a condition of at least part of the electrical network based on the one or more measurements of impedance including an impedance through at least one of the first branch, the second branch, or the common root part.

17. The electrical network monitoring unit of claim 16, wherein a fault is determined to have occurred if at least one of the following conditions is met:
(A) one or more of the measurements of impedance exceeds a maximum threshold value; or
(B) one or more of the measurements of impedance is below a minimum threshold value.

18. The electrical network monitoring unit of claim 16, wherein the electrical network monitoring unit is further configured to generate an electrical network condition report based at least in part on the at least one measurement of impedance, wherein the electrical network condition report is indicative of the condition of at least part of the electrical network.

19. The electrical network monitoring unit of claim 18, wherein if a fault in the electrical network is detected, the electrical network condition report comprises an indication of the fault.

20. The electrical network monitoring unit of claim 16, wherein the electrical network forms at least part of a data centre power distribution network.

* * * * *

UNITED STATES PATENT AND TRADEMARK OFFICE
CERTIFICATE OF CORRECTION

| | | |
|---|---|---|
| PATENT NO. | : 11,366,149 B2 | |
| APPLICATION NO. | : 16/936403 | |
| DATED | : June 21, 2022 | |
| INVENTOR(S) | : Stuart et al. | |

It is certified that error appears in the above-identified patent and that said Letters Patent is hereby corrected as shown below:

In the Claims

In Column 34, Line 16, in Claim 7, delete "east" and insert --least-- therefor

Signed and Sealed this
Thirteenth Day of February, 2024

Katherine Kelly Vidal
*Director of the United States Patent and Trademark Office*